United States Patent [19]

Nakagiri et al.

[11] Patent Number: 5,464,977
[45] Date of Patent: Nov. 7, 1995

[54] SCANNING OPTICAL DETECTION APPARATUS AND METHOD, AND PHOTOELECTRIC CONVERSION MEDIUM APPLIED THERETO

[75] Inventors: Nobuyuki Nakagiri; Hiroyuki Kondo, both of Tsukuba; Yoshihiko Suzuki, Funabashi, all of Japan

[73] Assignee: Nikon Corporation, Tokyo, Japan

[21] Appl. No.: 359,473

[22] Filed: Dec. 20, 1994

Related U.S. Application Data

[63] Continuation of Ser. No. 159,995, Nov. 30, 1993, abandoned.

[30] Foreign Application Priority Data

| Mar. 10, 1993 | [JP] | Japan | 5-049274 |
| Jun. 17, 1993 | [JP] | Japan | 5-146311 |
| Jun. 30, 1993 | [JP] | Japan | 5-160902 |

[51] Int. Cl.⁶ ................................................ H04N 5/30
[52] U.S. Cl. ............................................ 250/234; 250/306
[58] Field of Search ........................ 250/234, 201.1, 250/306, 307

[56] References Cited

U.S. PATENT DOCUMENTS

| 4,999,494 | 3/1991 | Elings | 250/306 |
| 5,025,658 | 6/1991 | Elings et al. | 250/306 |
| 5,308,974 | 5/1994 | Elings et al. | 250/234 |
| 5,323,003 | 6/1994 | Shido et al. | 250/307 |
| 5,338,932 | 8/1994 | Theodore et al. | 250/306 |

FOREIGN PATENT DOCUMENTS

| 2-123700 | 10/1988 | Japan. |
| 4-152289 | 5/1992 | Japan. |
| 5-52780 | 3/1993 | Japan. |

*Primary Examiner*—Edward P. Westin
*Assistant Examiner*—John R. Lee
*Attorney, Agent, or Firm*—Pennie & Edmonds

[57] ABSTRACT

The present invention provides an optical detection apparatus and an optical detection method for measuring at a high resolution an image in the wavelength range of from the infrared region to the gamma-ray region. The optical detection apparatus has a photoelectric conversion medium, which makes a change in electric property according to incidence of image in the wavelength range of from the infrared region to the gamma-ray region, a probe arranged in contact with the photoelectric conversion medium, and an urging mechanism for urging the probe against the photoelectric conversion medium to make the probe contact at a predetermined urging force with the medium. Further, the apparatus is so arranged that the urging mechanism keeps the probe in contact with the photoelectric conversion medium, a scanning device makes the probe relatively scan the photoelectric conversion medium in the contact state, a detector detects through the probe the change in electric property caused in the photoelectric conversion medium, and an information processor forms distribution information corresponding to the image in the wavelength range by making a correspondence between the change in electric property thus detected and the relative scan positions between the probe and the photoelectric conversion medium.

13 Claims, 13 Drawing Sheets

TO AMMETER

SCANNING OPTICAL DETECTION APPARATUS AND METHOD, AND PHOTOELECTRIC CONVERSION MEDIUM APPLIED THERETO

This is a continuation of application Ser. No. 08/159,995, filed Nov. 30, 1993, now abandoned.

BACKGROUND OF THE INVENTION

1. Field of the Invention

The present invention relates to an optical detection apparatus and an optical detection method for measuring with a high resolution an image in the wavelength range of from the infrared region to the gamma-ray region.

2. Related Background Art

There are known optical detection apparatus for optically detecting an image with a high resolution, for example, X-ray telescopes, and X-ray microscopes for obtaining an X-ray image under irradiation of X-rays on a subject. For example, an X-ray microscope using soft X-rays with wavelength ranging from 2 nm to 5 nm can achieve a higher resolution than one using visible light (with wavelength ranging from about 400 nm to 800 nm) and permits in observation of a live organism sample in water, which is thus useful in the fields of medicine and biology. Further, an X-ray microscope is constructed in general of an X-ray generator, a condenser optical system for collecting X-rays emitted from the X-ray generator to illuminate a sample to be observed, a focusing optical system for focusing an X-ray image transmitted by the sample, image pickup means positioned at the focus position of the focusing optical system to pick up the X-ray image, a vacuum receptacle enclosing an optical path between the X-ray generator and the image pickup means in vacuum, and an evacuation system for evacuating the vacuum receptacle.

Such X-ray microscopes were arranged to realize two-dimensional image pickup by employing, as the image pickup means located at the focus position, a photosensitive medium such as a silver salt film or a photoresist, an image pickup device in which a micro-channel plate (MCP) electron-intensifies the X-ray image and thereafter a fluorescent plate converts the X-ray image into a visible image, or a CCD solid-state image sensing device.

The image pickup device employing the CCD solid-state image sensing device or the micro-channel plate, however, had such a problem that a resolution of pixels for sensing the X-ray image was extremely lower than the resolution of X-ray image obtained in the wavelength range of X-rays, and that a finally observed image could not be formed at a high resolution despite that the X-rays were employed for obtaining a high resolution. There is a limit in miniaturizing the pixels in image pickup device. Specifically, the minimum size of a pixel is in the range of about 10 µm to ten and a few µm. Further remarkable miniaturization seems difficult at present. It is also conceivable that the resolving power of an image pickup device can be relatively increased by employing a high-magnification focusing optical system. It could instead raise another problem of increase in size of optical systems (e.g., the focusing optical system), which results in increasing the size of the entire optical detection apparatus, in addition to the difficulty in producing X-ray optical elements.

In case that a photosensitive medium such as a silver salt film or a photoresist is used as the image pickup medium, a high resolution can be obtained to some extent. However, it had a problem of worse operability, for example a relatively longer time necessary for development, and troublesome works necessary for taking a photosensitive medium out of the vacuum receptacle and setting another one at every observation.

Developed as means for solving such technical problems in the conventional apparatus was an X-ray image detecting apparatus utilizing the so-called tunneling, which detects photoelectrons produced in a photoelectric surface upon incidence of X-ray image by means of a conductive probe arranged apart from the photoelectric surface. It is described for example in Japanese Laid-open Patent Applications No. 2-123700, No. 4-152289, No. 5-52780. In a typical example as described in Japanese Laid-open Patent Application No. 4-152289, a probe two-dimensionally scans a photoelectric surface in a non-contact state and a current flowing into the probe due to the tunneling is detected to obtain a distribution of photoelectrons which increase in proportion to an X-ray irradiation intensity in each portion in X-ray image, whereby the X-ray image is two-dimensionally detected theoretically at an extremely high resolution.

Such means also has a big problem to be solved. Namely, a very serious point is that in order to achieve a high resolution, two-dimensional scan must be carried out while keeping the tip of probe opposed to the photoelectric surface (surface to be detected) at a constant and very small clearance therebetween (for example at a clearance of ten angstroms). Such means can attain a theoretically very high resolution, but the non-contact scan is very difficult even with high-precision servo system. Actually, the photoelectric surface is uneven, or the clearance varies between the probe and the photoelectric surface during scan, which causes a change in current, an amount of which is information to be detected, according to the clearance variation (which means that the detection sensitivity varies depending upon the scanned portion). Thus, the detected current includes errors, which lowers the detection accuracy. Accordingly, it was practically impossible to make the clearance between the photoelectric surface and the probe very small and, therefore, high resolution optical detection has not been achieved.

SUMMARY OF THE INVENTION

It is a first object of the present invention to provide an optical detection apparatus and an optical detection method therefor which can achieve an extremely high resolution (in the order of micrometer), solving the problems in the conventional apparatus and methods.

It is a second object of the present invention to provide a photoelectric conversion medium applicable to such high-resolution optical detection.

It is a third object of the present invention to provide an optical detection apparatus with high resolution which permits variable control of the resolution, an optical detection method therefor, and a photoelectric conversion medium applicable thereto.

It is a fourth object of the present invention to provide an optical detection apparatus for optically detecting an image with wavelength in the range of from the infrared region to the gamma-ray region, an optical detection method therefor, and a photoelectric conversion medium applicable thereto.

It is a fifth object of the present invention to provide an optical detection apparatus simple in structure, excellent in controllability and excellent in operability.

It is a sixth object of the present invention to provide an optical detection apparatus and a photoelectric conversion medium which can nondestructively hold optically-detected image information.

To achieve the above objects, a scanning optical detection apparatus of the present invention is provided with a photoelectric conversion medium which produces a change in electric property according to incidence of image with wavelength in the range of from the infrared region to the gamma-ray region, a probe arranged in contact with the photoelectric conversion medium, and urging means for making the probe contact with the photoelectric conversion medium by a predetermined urging force, in which while the probe and the photoelectric conversion medium are kept in contact with each other by the urging means, scanning means performs relative scan between the probe and the photoelectric conversion medium, in which detecting means detects through the probe a change in electric property caused in the photoelectric conversion medium, and in which information processing means forms distribution information corresponding to the image in the wavelength range while making a correspondence between detected changes in electric property and positions of the relative scan between the probe and the photoelectric conversion medium.

A photoelectric conversion medium comprises a conversion layer for emitting photoelectrons in accordance with incidence of the image in the wavelength range, a charge storage layer made of a non-conductive material which can store and hold a charge in correspondence to the photoelectrons, and an insulating layer provided between the conversion layer and the charge storage layer, which is arranged such that a charge distribution in the charge storage layer is detected during contact scan with the probe.

Also, another photoelectric conversion medium has a charge storage layer made of a non-conductive material which can have the external photoelectric effect according to incidence of image in the wavelength range, which is arranged to detect a charge distribution stored in the charge storage layer during contact scan with the probe.

Still another photoelectric conversion medium has a photoconductor layer which can have the photoconduction effect according to incidence of image in the wavelength range, which is arranged to detect an electric change due to the photoconduction effect during contact scan with the probe.

The probe is produced in a very fine shape, employing the lithography technology or the thin film technology in the semiconductor production technology, so that the contact end (tip) of probe is so finely shaped as to obtain a high resolution. Also, a supporting portion for supporting the probe is formed integrally with the probe by the same fine processing technology, and is made of a material having elasticity so as to obtain a mutual contact force (urging force) between the probe and the photoelectric conversion medium.

In measurement using such scanning optical detection apparatus so arranged, the probe moves in scanning in contact with the photoelectric conversion medium always under a constant urging force, which will never cause degradation in measurement accuracy as could be caused by variations in clearance between the probe and the medium, which was a drawback in the conventional technology. In other words, the high-resolution image, obtained with radiation source in the wavelength range of the infrared region to the gamma-ray region, can be optically detected at a high resolution also by detecting means (on the photoelectric conversion medium side), which enables very stable high-resolution optical detection as a whole.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE PREFERRED EMBODIMENTS

Embodiment 1

Figure 1:
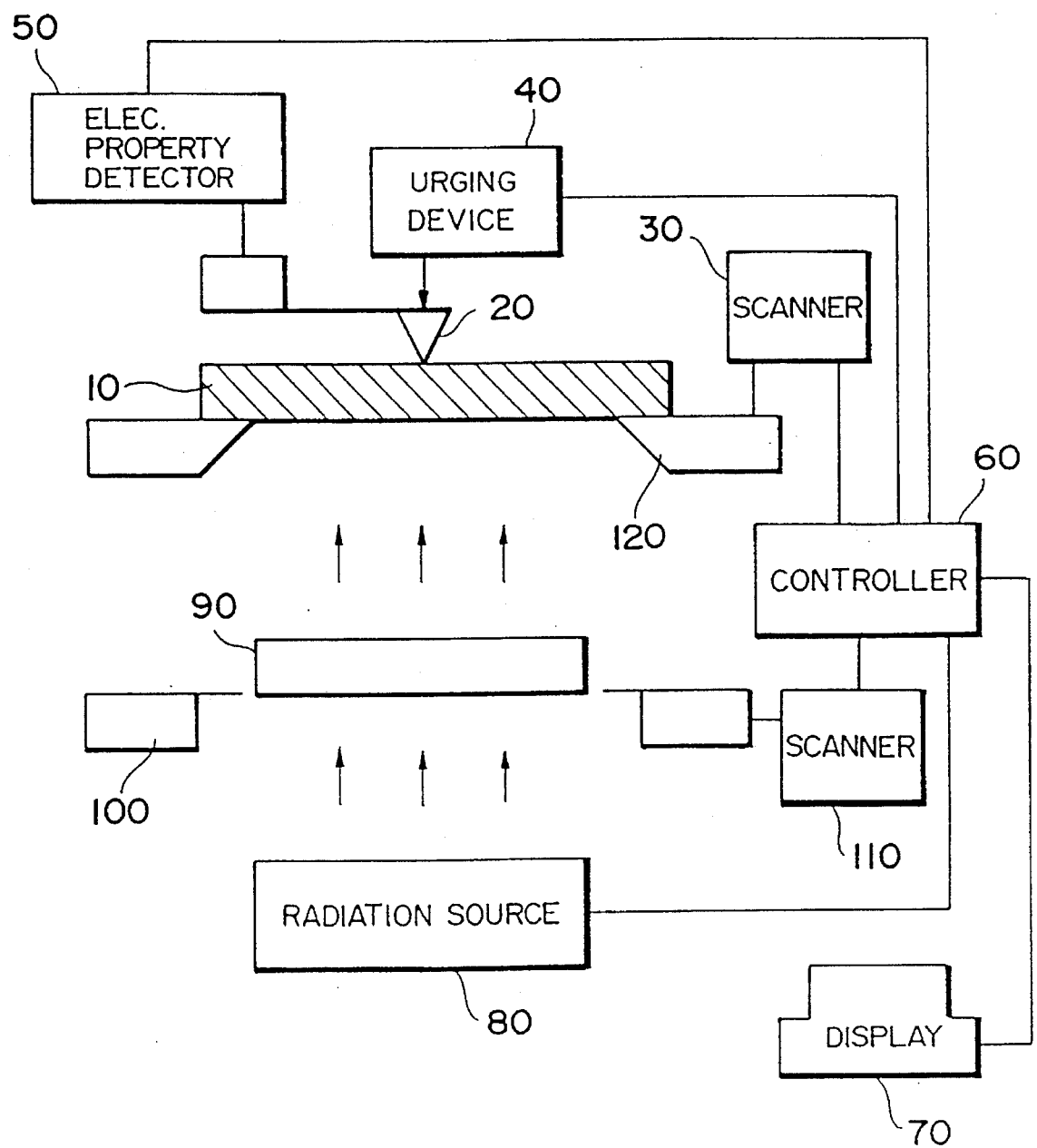
FIG. 1 is a schematic constitutional drawing to show the first embodiment of scanning optical detection apparatus.

The first embodiment of the present invention will be described with FIG. 1 to FIG. 6. First described with FIG. 1 is the schematic structure of a scanning optical detection apparatus in the present embodiment. The apparatus is provided with a photoelectric conversion medium 10, which upon incidence of an image (in other words; light having the two-dimensional spatial image information) of a sample (a measured sample) including wavelength components in the wavelength range of from the infrared region to the gamma-ray region, internally generates a distribution of electrical two-dimensional change according to the sample image (i.e., two-dimensional spatial image); a probe 20 arranged in contact with the photoelectric conversion medium 10; scanning means 30 for scanning the probe 20 by two-dimensionally moving the probe 20 relative to the photoelectric conversion medium 10; urging means 40 for urging the probe 20 against the photoelectric conversion medium 10 by a predetermined weak force; detecting means 50 for detecting through the probe 20 the electrical change distribution internally generated in the photoelectric conversion medium 10; information processing and controlling means 60 for forming a data group of two-dimensional image information corresponding to the two-dimensional change distribution from position information outputs from the scanning means 30 (information outputs each representing a relative contact position between the probe 20 and the photoelectric conversion medium 10) and detection outputs from the detecting means 50; display means 70 for performing image reproduction based on the data group of two-dimensional image information; and a radiation source 80 for radiating illumination light in the wavelength range of from the infrared region to the gamma-ray region (for convenience in description, the illumination in the short wave range will be called as illumination light) toward the photoelectric conversion medium 10.

The apparatus further has a movable stage 100 for setting a sample between the photoelectric conversion medium 10 and the radiation source 80, and scanning means 110 for adjusting the position of sample 90 opposed to the photoelectric conversion medium 10 and to the radiation source 80 by drive-controlling the movable stage 100. The movable stage 100 can be operated to adjust the distance between the sample 90 and the photoelectric conversion medium 10 and the facing gap between the sample 90 and the radiation source 80 (i.e., to adjust the Z-coordinate position) and to two-dimensionally move the sample 90 in the XY coordinate plane (plane perpendicular to the Z-coordinate direction) while keeping constant in the Z-coordinate direction the facing gaps of the sample 90 relative to the photoelectric conversion medium 10 and to the radiation source 80.

The scanning means 30 is provided for drive-controlling a support stage 120 supporting the photoelectric conversion medium 10 and being movable in the three X, Y, Z coordinate directions. The scanning means 30 controls a fine motion of the support stage 120 in the Z-coordinate direction to maintain a mutually urging force constant between the probe 20 and the photoelectric conversion medium 10 while it also controls the movement of the stage 120 in the X, Y coordinate directions to achieve relative scan (two-dimensional scan) between the probe 20 and the photoelectric conversion medium 10. The scanning means 110 is provided for setting the distance relation between the sample 90 and the photoelectric conversion medium 10 mainly upon so-called exposure.

The information processing and controlling means 60 includes a built-in microprocessor, which totally controls the entire operation of the optical detection apparatus, including processing of detection signals from the electric property detecting means 50, a control for making constant the relative urging force between the probe 20 and the photoelectric conversion medium 10 by the urging means 40, a control of operation of the scanning means 30, 110, a control of lighting or unlighting of the radiation source 80, a display operation control of the display means 70, and other various operations.

In measurement with the optical detection apparatus as so arranged, the illumination light from the radiation source 80 irradiates the sample 90 then to pass therethrough and an image of the measured sample formed upon transmission through the sample 90 is applied to the photoelectric conversion medium 10. This causes the photoelectric conversion medium 10 to have a change in electric property (which is a two-dimensional change distribution) corresponding to the sample image (two-dimensional spatial image). Then, when the probe 20 is two-dimensionally moved for scan relative to the photoelectric conversion medium 10 in contact therewith, the electric property detecting means 50 detects the change in electric property caused in the photoelectric conversion medium 10 as electric signals. Accordingly, the probe 20 slides on the detection surface of photoelectric conversion medium 10 while being kept to contact therewith by the always constant urging force in scanning of the probe 20, which makes the apparatus free of the degradation in measurement accuracy as could be caused by variations in clearance between the probe and the image pickup medium, which was the drawback in the conventional technology. Namely, high-resolution optical detection is possible on the detecting means side (i.e., on the photoelectric conversion medium 10 side) for the measured-sample image with high resolution obtained using the radiation source 80 in the wavelength range of from the infrared region to the gamma-ray region. Therefore, the high-resolution optical detection can be carried out in a very stable manner as a whole.

Next described are the schematic structure and the function of the photoelectric conversion medium 10 employed in the present embodiment. The photoelectric conversion medium 10 has a three-layer structure composed of a photoelectron emission layer made of a material revealing a property of photoelectric effect, in which photoelectrons are internally generated upon incidence of light in the wavelength range of from the infrared region to the gamma-ray region, an insulating layer prepared on the photoelectron emission layer, and a charge storage layer prepared on the insulating layer and made of a non-conductive material. The light, which forms an sample image on the photoelectron emission layer, internally produces photoelectrons and holes in an amount corresponding to the two-dimensional intensity distribution. Then the holes are recombined with internal free electrons to vanish, but some part of photoelectrons in each portion pass through the insulating layer to reach each corresponding portion in the charge storage layer. In the charge storage layer, the photoelectrons coming through the insulating layer are recombined with the positive charge preliminarily present in each portion inside, whereby an amount of positive charge decreases in the recombined portion. Since the charge storage layer is made of a non-conductive material allowing little diffusion of charge (or regulating free movement of internal charge), it can hold a distribution of stored charge corresponding to the measured-sample image (two-dimensional spatial image). In other words, the photoelectric conversion medium 10 has a function to convert the measured-sample image (two-dimensional spatial image) into a so-called latent image of two-dimensional charge distribution and to hold it. The two-dimensional charge distribution can be detected, or the measured-sample image can be measured by the contact scanning the photo conversion medium 10. Also, when a certain voltage is applied from the outside to make the charge storage layer in a positive potential with respect to the potential of the photoelectron emission layer, the positive charge can be made uniformly distributed in the charge storage layer. Thus, with such application of predetermined voltage, the so-called latent image can be erased and another latent image corresponding to a new measured-sample image can be formed. Until the application of such predetermined voltage, the latent image can be held in a non-destructive condition. As described, the photoelectric conversion medium 10 permits the infinite number of measured-sample images to be two-dimensionally written and erased, and the written information to be read in a non-destructive manner.

Next described is the principle of measurement of such charge distribution. Applying to between the probe 20 and the photoelectron emission layer a predetermined voltage which establishes such a potential relation that the probe 20 contacting with the charge storage layer is positive and the photoelectron emission layer is negative, in the state that the two-dimensional charge distribution is formed as the latent image in the charge storage layer, a depletion layer is formed in the photoelectron emission layer near the probe 20 on the charge storage layer side. The thickness of depletion layer depends upon an amount of positive charge in the charge storage layer near the probe 20. As the thickness of depletion layer varies, the electrostatic capacitance between the probe 20 and the photoelectron emission layer also varies. Using this property, the charge distribution in the charge storage layer can be indirectly measured. The electric property detecting means 50 measures the charge distribution in the charge storage layer during relative movement between the probe 20 and the photoelectric conversion medium 10, based on such measurement principle. A semiconductor layer (p-type silicon layer) may be used as the photoelectron emission layer. In order to store the charge distribution in a stable condition, the charge storage layer is preferably made of a non-conductive material allowing little diffusion of charge, for example silicon nitride (SiN). The use of such material for the charge storage layer permits repetitive operations of erasing, so-called rewriting and re-reading of the charge distribution without limit. Also, the charge storage layer regulates free movement of charge, whereby a high-resolution charge distribution can be maintained.

Figure 2:
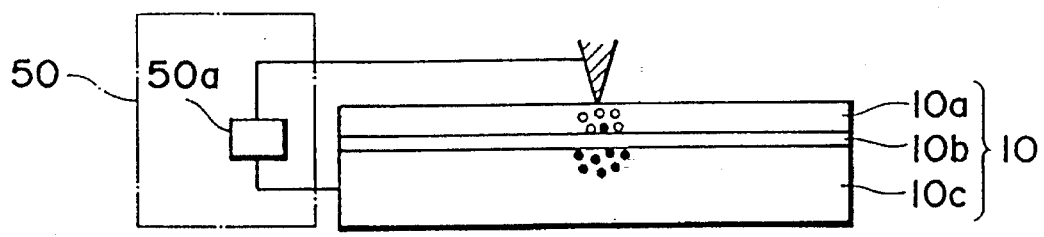
FIG. 2 is a vertical cross section to show the structure and function of photoelectric conversion medium employed in the first embodiment.
Figure 3:
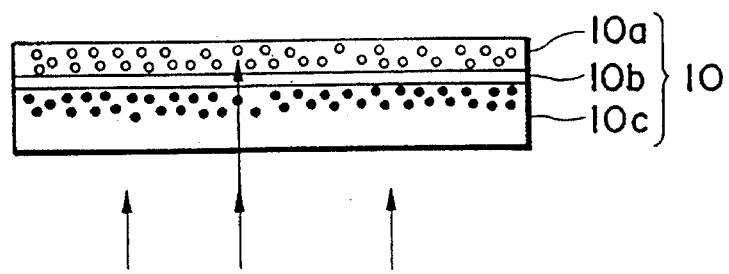
FIG. 3 is an explanatory drawing to illustrate a write function of the photoelectric conversion medium employed in the first embodiment.
Figure 4:
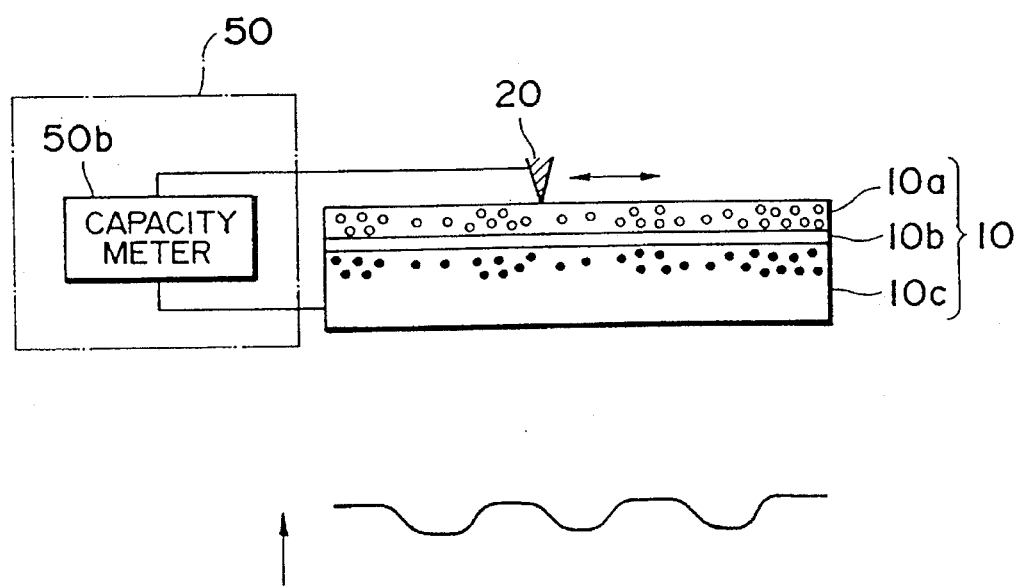
FIG. 4 is an explanatory drawing to illustrate a read function of the photoelectric conversion medium employed in the first embodiment.

Further described referring to FIG. 2 to FIG. 4 are an example of more specific structure of the photoelectric conversion medium 10 and the operation thereof. The photoelectric conversion medium 10 shown in FIG. 2 has a three-layer structure composed of a charge storage layer 10a made of silicon nitride (SiN), an insulating layer 10b made of a p-type silicon layer (p-Si) and a photoelectron emission layer 10c. The thickness of charge storage layer 10a is set in the range of from about 100 to 500 Å, the thickness of insulating layer 10b is set in the range of from about 30 to 50 Å, and the thickness of photoelectron emission layer 10c for example not more than several micronmeter, considering an absorptance of used X-rays for irradiation in the photoelectron emission layer 10c.

Next described is the operation in the case that the measured-sample image (X-ray image) is obtained employing the photoelectric conversion medium 10 in the specific example. An initialization process is first carried out preliminarily before image-pickup by applying the predetermined voltage to the medium to make the charge storage layer 10a in a positive potential and the photoelectron emission layer 10c in a negative potential, whereby the charge storage layer 10a is filled with the positive charge. In the case that the initialization process is carried out using the probe 20, the probe 20 is urged against the charge storage layer 10a in contact therewith and the relative scan is performed between the probe 20 and the charge storage layer 10a while applying a voltage for example of about 40 volts to between the probe 20 and the photoelectron emission layer 10c by voltage applying means 50a built in the electric property detecting means 50, as shown in FIG. 2. This creates the initialized state in which the charge storage layer 10a is charged positive and the photoelectron emission layer 10c negative. The insulating layer 10b has a function to prevent, in the state of no external energy being supplied, electrons from moving from the photoelectron emission layer 10c to the charge storage layer 10a or from the charge storage layer 10a to the photoelectron emission layer 10c, so that electrons become gathered near the border between the photoelectron emission layer 10c and the insulating layer 10b.

When the measured-sample image (X-ray image) is made incident into the photoelectron emission layer 10c in this initialized state, as shown in FIG. 3, the photoelectron emission layer 10c internally emits photoelectrons in each portion by the photoelectric effect. An amount of photoelectrons depends upon an intensity and a time duration of irradiation of X-rays incident into each portion. The photoelectrons in each portion are attracted by the positively charged charge storage layer 10a and captured by the positive charge therein in the state of suppressed dispersion. Accordingly, each portion in the charge storage layer 10a reduces its positive charge in correspondence with the amount of photoelectrons therein, changing the charge distribution. The distribution of charge change corresponds to the intensity distribution in the measured-sample image. In more detail, in mutually corresponding portions between the photoelectron emission layer 10c and the charge storage layer 10a, the degree of decrease in positive charge in the charge storage layer 10a becomes grater as the amount of incident X-rays into the photoelectron emission layer 10c increases; conversely, the degree of decrease in positive charge in the charge storage layer 10a becomes smaller as the amount of incident X-rays into the photoelectron emission layer 10c decreases. As a result, the charge distribution stored between the charge storage layer 10a and the insulating layer 10b becomes a so-called latent image corresponding to the intensity distribution of sample.

Then, to detect (read) the latent image as the charge distribution, a capacitance meter 50b built in the electric property measuring means 50 is connected to the probe 20, and the probe 20 two-dimensionally scans the charge storage layer 10a in contact therewith, whereby an electrostatic capacitance is finely measured in each portion. Then a two-dimensional image is observed from the change in electrostatic capacitance depending upon the portion.

Figure 5:
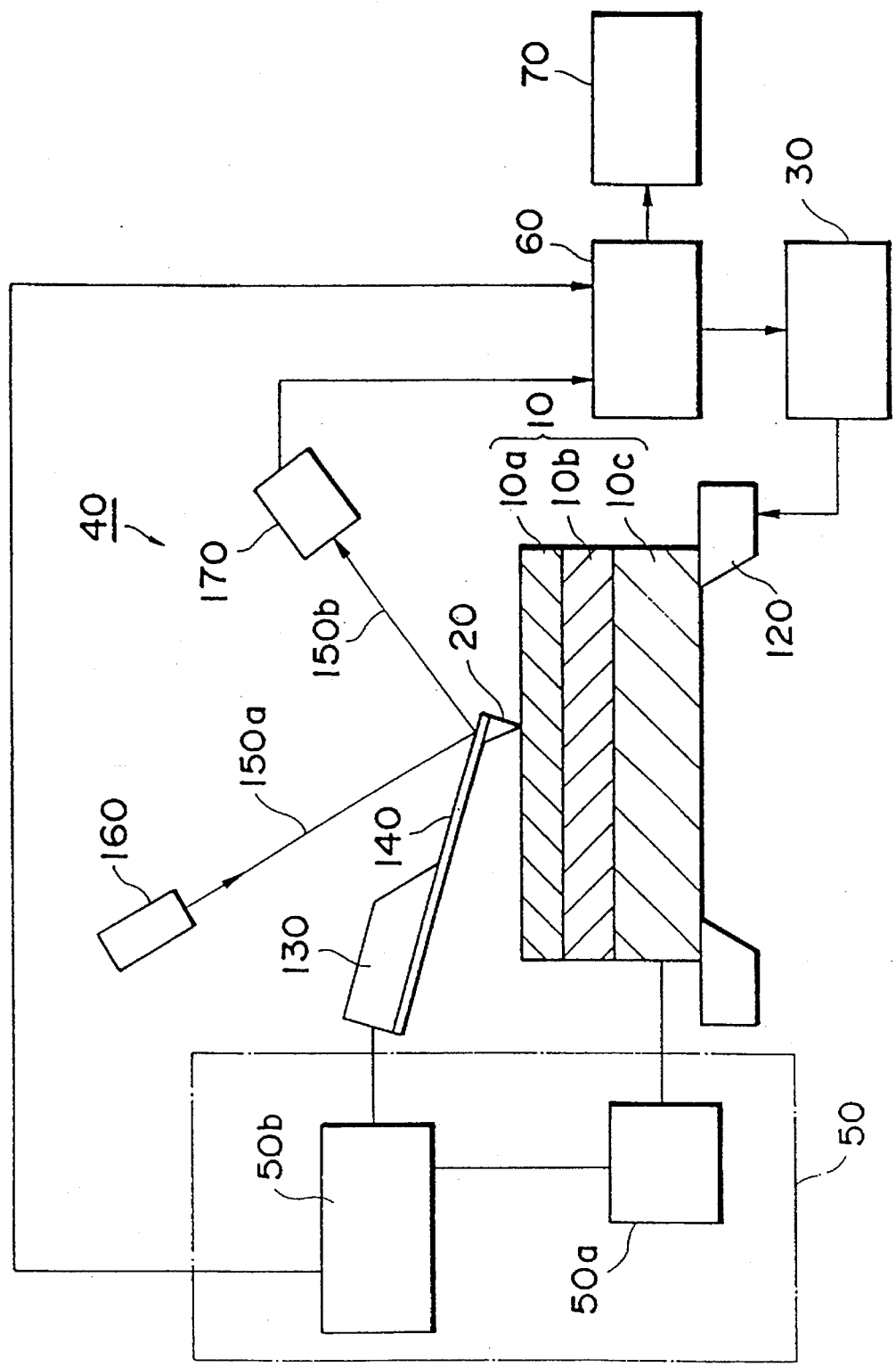
FIG. 5 is an explanatory drawing to show a more specific structure of the first embodiment of scanning optical detection apparatus.

Next described with FIG. 5 are a more specific structure and the operation of the urging means 40 in the present embodiment. The urging means 40 presents a desired urging function in cooperation with the scanning means 30, the electric property detecting means 50, the information processing and controlling means 60 and the support stage 120, which will be also described below.

A conductive probe 20 is fixed at the fore end of a plate-spring cantilever 140 having elasticity. The cantilever 140 is fixed to a support parts 130. The tip end of the probe 20 is finely formed for example in radius of curvature of several ten nm. The probe 20 is connected to the voltage applying means 50a and the capacitance meter 50b in the electric property detecting means 50. The voltage applying means 50a is provided for applying a predetermined voltage to between the photoelectron emission layer 10c and the probe 20 contacting with the charge storage layer 10a in the photoelectric conversion medium 10, and the capacitance meter (capacitor sensor) 50b is for detecting the charge distribution in the charge storage layer 10a.

The photoelectric conversion medium 10 is set on the support stage 120. The support stage 120 is arranged movable in the X, Y, Z coordinate directions upon power supply from the scanning means 30. The scanning means 30 drives the support stage 120 in accordance with a command from the information processing and controlling means 60. In the present embodiment, the urging force is controlled by relatively applying between the probe 20 and the charge storage layer 10a an elastic force according to an amount of deflection of the cantilever 140 upon contact between the probe 20 and the charge-storage layer 10a in the photoelectric conversion medium 10. Specifically, the urging force is set in the range of from $10^{-8}$N to $10^{-9}$N.

The information processing and controlling means 60 also executes information processing to obtain a charge distribution in the charge storage layer 10a during scanning by making a correspondence between positions (measured portions in the XY coordinates) of the probe 20 on the charge storage layer 10a and capacitance values detected at the respective positions by the capacitance meter 50b. The display means 70 reproduces to display the two-dimensional image of sample, based on the information of charge distribution obtained by the information processing and controlling means 60.

The urging means 40 performs such a control that the probe 20 scans the surface of charge storage layer 10a in contact therewith under a constant urging force. The urging means 40 has a point light source 160 for emitting measurement light (laser light) 150a toward a reflective part provided at one end of the cantilever 140 in the vicinity of the probe 20, light detecting means (for example a bisectional photodetector) 170 for detecting reflected light 150b reflected on the reflective part, and Z-direction controlling means for detecting a deflection amount of the cantilever 140 from an output from the light detecting means 170 and moving the support stage 120 in the Z direction so as to keep the deflection amount constant (i.e., so as to keep the output from the photodetector 170 constant). The Z-direction controlling means is constituted by the controlling means 60 and the scanning means 30. A resolution in the order of subnanometer is preferable for measurement of probe displacement in the urging means 40. In addition to the arrangement employed in the present embodiment that the measurement light 150a is emitted to impinge on the reflective part of cantilever 140, the displacement measurement system of probe 40 may be an arrangement that the radiated light onto the cantilever 140 and the reflected light therefrom is made to interfere with each other thereby to measure displacement of probe 20, or an arrangement that a probe of STM (scanning tunneling microscope) is disposed on the back surface of cantilever 140 to measure the displacement by measuring a tunnel current between the probe of STM and the cantilever 140.

The measurement of charge distribution is made such that the controlling means 60 drives the support stage 120 to scan the surface of charge storage layer 10a by the probe 20 in the X and Y directions. Since the probe displacement measuring system performs a control to keep the deflection amount of cantilever 140 constant during measurement, the probe 20 scans the surface of charge storage layer 10a while contacting with the surface always with a constant force. The capacitance meter 50b detects a magnitude of charge amount in each measured position as an electrostatic capacitance between the probe 20 and the conversion layer 10c thereat, and outputs the result to the controlling means 60. The controlling means 60 obtains a distribution of charge in the charge storage layer 10a from values of electrostatic capacitance measured by the capacitance meter 50b and positions at which the values were detected in the charge storage layer 10a, and then sends the information to the display means 70. The display means 70 displays the charge distribution sent from the controlling means 60 as an image (picture image) of sample by the X-rays.

This embodiment is advantageous in that the image pickup can be done without lowering the resolution of X-ray image because of its high resolving power. This optical detection apparatus can be also used for initializing the photoelectric conversion medium 10 by forming the positive charge in the charge storage layer 10a as described above and for erasing an image recorded in the photoelectric conversion medium 10.

Figure 6:
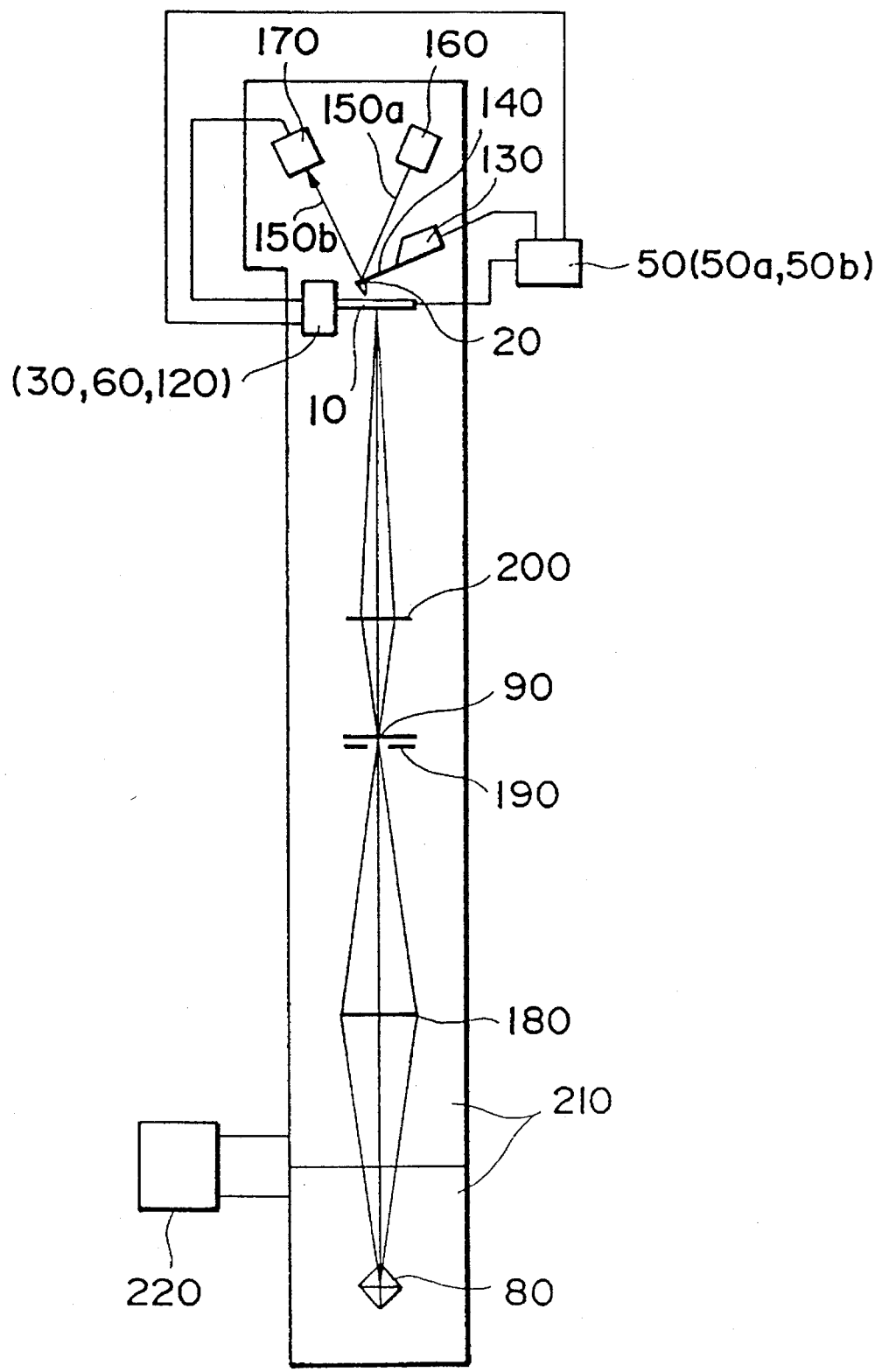
FIG. 6 is a constitutional drawing of an X-ray microscope to which the first embodiment of scanning optical detection apparatus is applied.

FIG. 6 is a schematic constitutional drawing to show an example of X-ray microscope provided with the optical detection apparatus of the present embodiment. In FIG. 6, constituent elements having the same functions as those in FIG. 5 are denoted by the same reference numerals. The X-ray microscope has an X-ray optical system composed of an X-ray source 80, a condenser optical system composed of a condenser optical element 180 for collecting X-rays emitted from the X-ray source 80 to irradiate the sample 90 and a stop 190, a focusing optical element 200 for focusing an X-ray image passing through the sample 90, and a photoelectric conversion medium 10 disposed at the focus position of the focusing optical element 200; a vacuum receptacle 210 for keeping a vacuum in the optical path between the X-ray source 80 and the photoelectric conversion medium 10; and an evacuation system 220 for evacuating the vacuum receptacle 210.

Further, the microscope is provided with means for reading an image of sample 90 recorded in the photoelectric conversion medium 10, which is composed of a support stage 120 for moving the photoelectric conversion medium 10 in the X, Y, Z directions, a cantilever 140 at the fore end of which a probe 20 is provided, electric property detecting means 50 including a capacitance meter 50b and voltage applying means 50a, a point light source 160 for radiating measurement light 150a toward a reflective plane of cantilever 140, and a photodetector 170 as probe displacement measuring means. The capacitance meter 50a is provided for detecting an amount of capacitance in the charge storage layer in the photoelectric conversion medium 10. Controlling means 60 makes a correspondence between positions of probe 20 on the charge storage layer and measurement results at the respective positions by the capacitance meter 50a and makes display means (not shown) display the charge distribution in the charge storage layer as an image of the sample 90. The point light source 160 and the photodetector 170 for measuring the displacement of probe constitute a probe displacement measuring system. The photodetector 170 detects measurement light 150b reflected by the reflective plane of cantilever 140. The position of support stage 120 is finely adjusted in the Z-coordinate direction so as to keep the deflection amount of cantilever 140 constant, based on the outputs from the photodetector 170.

In the X-ray microscope as so arranged, the sample 90 is irradiated by X-rays through the X-ray optical system in the initialized state of photoelectric conversion medium 10 and the X-ray image passing through the sample 90 is let to impinge on the photoelectric conversion medium 10. The image of the sample 90 is recorded in the photoelectric conversion medium 10 as a charge distribution, and, therefore, the image of the sample 90 can be observed by measuring the charge distribution as described above. In the arrangement, as shown in FIG. 6, the capacitance meter 50b in the electric property detecting means 50 is disposed outside the vacuum receptacle 210, so that the image of the sample 90 can be observed without taking the photoelectric conversion medium 10 out of the vacuum receptacle 210. However, if the capacitance meter 50b is set in the vacuum receptacle 210 and the signals from the capacitance meter 50b are guided outside the receptacle 210, the accuracy in capacitance metering can be further higher, because the influence of stray capacitance or the like can be reduced. Either case can obviate a work for releasing the vacuum in the vacuum receptacle 210 and again evacuating the receptacle 210 for observation of image. Also, the recorded image can be erased as the photoelectric conversion medium 10 is kept in the receptacle 210, so that imaging can be repetitively carried out an arbitrary number of times. For example, providing a mechanism for moving the sample 90 in the vacuum receptacle 210, different portions in the sample 90 can be observed on a single photoelectric conversion medium 10. It should be, however, noted that since the capacitance meter 50b lowers the measurement accuracy when it is set at a distance far from the cantilever 140, it is preferably set near the cantilever 140.

Incidentally, the positive charge density of SiN used as the charge storage layer in this embodiment is about 10 per square nm. Thus 256 gradations can be theoretically realized in 26 square nm, which means that a pixel is 5 nm×5 nm. The resolving power of the optical detection apparatus depends upon the shape of probe. This embodiment can achieve a resolution of several ten nm. This value is higher than those by solid-state image sensing devices or microchannel plates (MCP) conventionally used.

In this embodiment, the X-ray image on the photoelectric conversion medium is recorded as a charge distribution corresponding to the photoelectrons produced upon X-ray irradiation and the charge distribution is detected as a change in electrostatic capacitance. The present invention is not limited to this example. For example, the image can be detected such that with a probe scanning the medium in contact therewith by a certain weak force a physical or chemical change caused by the X-ray irradiation in the photoelectric conversion medium is measured as an electric current, a voltage, a dielectric constant or an electromotive force.

As described above, the first embodiment can attain the practical scanning optical detection apparatus and method which can detect an image of object irradiated by electromagnetic waves such as X-rays, at an extremely high resolution of micrometer order identical to the resolution of X-rays in a relatively simple arrangement.

Also, all operations for measurement can be carried out in vacuum, the photoelectric conversion medium can be stored in air if desired after taken out of the apparatus, and the charge distribution may be measured in air by the optical detection apparatus, if necessary. Further, repetitive measurements are possible by erasing the recorded image in the photoelectric conversion medium once used, which reduces the production cost.

The photoelectric conversion medium in this embodiment requires only a short time for recording an image, for example allowing a few images per second, and, therefore, can be used as means for recording a dynamic image.

Embodiment 2

Figure 7:
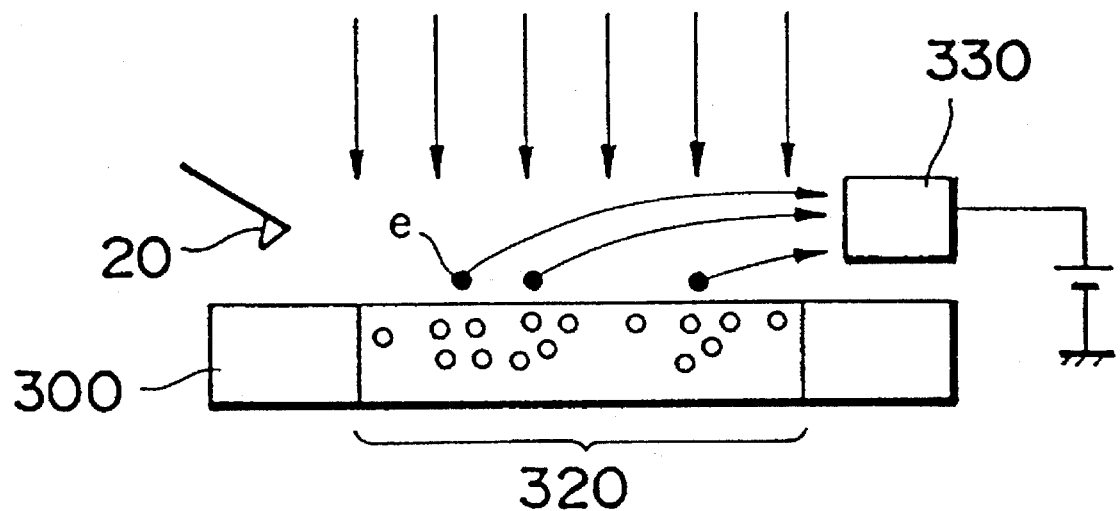
FIG. 7 is a vertical cross section to show the construction and a write function of a photoelectric conversion medium employed in the second embodiment.
Figure 8:
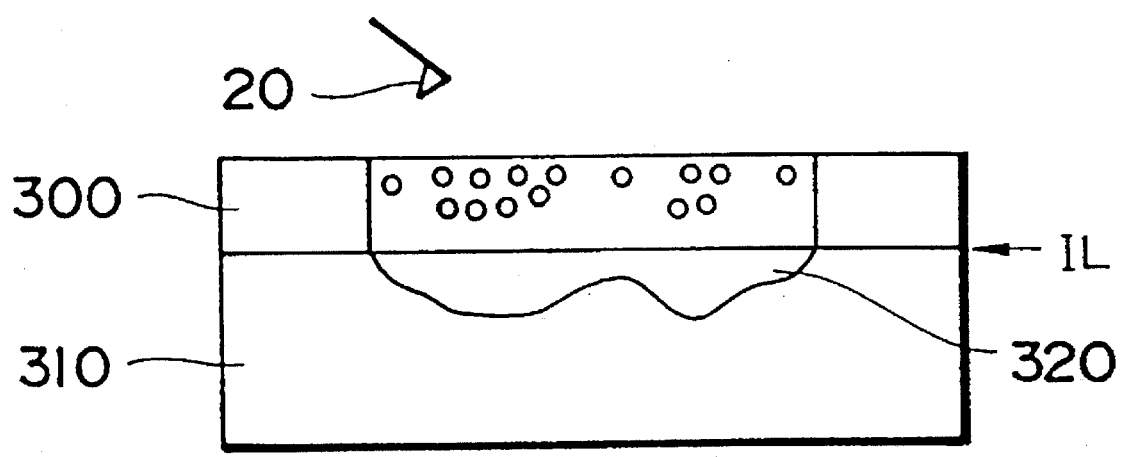
FIG. 8 is an explanatory drawing to illustrate a read function of the photoelectric conversion medium employed in the second embodiment.

The second embodiment will be next described with FIG. 7 to FIG. 10. The general construction of scanning optical detection apparatus in the second embodiment is the same as that in the first embodiment shown in FIG. 1. A difference exists in the photoelectric conversion medium 10. First described referring to FIG. 7 and FIG. 8 are the structure and the function of a photoelectric conversion medium 10 employed in this embodiment.

In FIG. 7, a light including information of image is made to irradiate a charge storage layer 300 made of a non-conductive material to cause the external photoelectric effect, and a charge distribution internally formed in the storage layer 300 by the photoelectric effect is recorded as an image. An auxiliary layer 310 made of a p-type semiconductor is formed on the charge storage layer 300 and the charge distribution is measured in the state that a depletion layer 320 corresponding to the charge distribution in the charge storage layer 300 is formed in the auxiliary layer 310, whereby the thus recorded image is read out.

The photoelectric conversion medium 10 is constituted in a united manner by a charge storage layer 300 made of a non-conductive material which emits photoelectrons upon irradiation with light, and an auxiliary layer 310 made of a p-type semiconductor which is deposited on the charge storage layer 300, and forms a depletion layer depending upon the charge distribution in the charge storage layer 300. Further, the apparatus is provided with a probe 20 for scanning the surface of charge storage layer 300 in the photoelectric conversion medium, moving or scanning means for moving the probe 20 relative to the photoelectric conversion medium 10, and charge distribution measuring means for obtaining a charge distribution by measuring an electrostatic capacitance between the auxiliary layer 310 in the photoelectric conversion medium 10 and the probe 20.

The photoelectric conversion medium 10 in the present embodiment converts an intensity distribution in a light (light image) in the wavelength range of from the infrared region to the gamma-ray region into a charge distribution in the charge storage layer 300 to record it, and provides an image by reading the charge distribution.

The principle of measurement (image pickup) will be further described referring to FIG. 7 and FIG. 8.

For example, suppose the apparatus is applied to an X-ray microscope. Then, X-rays passing through a sample have different intensities after transmission depending upon the transmitting portion through the sample, providing an intensity distribution corresponding to the sample image. Accordingly, when the X-ray image (light image) passing through the sample is made to irradiate the charge storage layer 300 as shown in FIG. 7, the charge storage layer 300 emits photoelectrons "e" by the external photoelectric effect in an amount depending upon a quantity of light (intensity) and an irradiation time duration of X-ray image upon irradiation. As a result, a positive charge in an amount corresponding to the amount of the thus emitted photoelectrons "e" is two-dimensionally distributed in incidence region 320 in the charge storage layer 300 according to the distribution of light quantity in X-ray image. Namely, an amount of positive charge is large in a portion which is irradiated by a large light quantity of X-ray image, while the quantity of positive charge is small in a portion which is irradiated by a small light quantity of X-ray image. Accordingly, a charge distribution formed by the change in charge amount can be used as a latent image obtained by the X-ray image. If the emitted photoelectrons "e" should again enter the charge storage layer 300, a good correspondence could not be expected between the intensity distribution of radiated X-ray image and the charge distribution-formed in the charge storage layer 300. It is thus preferable that the irradiation of X-ray image is performed in the state that the photoelectric conversion medium 10 having the charge storage layer 300 is set in vacuum and that an electrode 300 having a positive potential is placed near the charge storage layer 300 as shown in FIG. 7 to capture the emitted photoelectrons "e".

In measuring the charge distribution formed in the charge storage layer 300, the spatial resolution can be achieved up to the nanometer order, using charge distribution measuring means for locally measuring a charge capacitance (electrostatic capacitance). The charge distribution formed in the charge storage layer 300 corresponds to an amount of charge accumulation therein. When the auxiliary layer 310 made of a p-type semiconductor is formed on the charge storage layer 300, as shown in FIG. 8, a depletion layer 320 is formed inside the auxiliary layer 310 on the border side to the charge storage layer 300 in a thickness depending upon a charge accumulation amount in the charge storage layer 300. Since the thickness of depletion layer 320 can be detected as an electrostatic capacitance between the auxiliary layer 310 and the probe 20 scanning the surface of charge storage layer 300 in contact therewith, the charge distribution can be obtained by measuring an electrostatic capacitance between the probe 20 and the auxiliary layer 310 at a position where the probe 20 is located. Thus, a charge distribution is measured while the probe 20 scans the surface of charge storage layer 300 in the photoelectric conversion medium 10 by the moving or scanning means for relatively moving the charge distribution measuring means relative to the photoelectric conversion medium 10, whereby the information of image (latent image) recorded in the charge storage layer 300 can be obtained.

The non-conductive material used for charge storage layer 300 is preferably a material allowing little diffusion of charge (for example SiN: silicon nitride) in order to store the charge in a stable condition. Also, an insulating layer, which can prevent electrons from moving between the charge storage layer 300 and the auxiliary layer 310, may be provided between the charge storage layer 300 and the auxiliary layer 310 (in a space represented by IL in FIG. 8) in order to maintain the charge distribution formed in the charge storage layer 300 in a stable condition. This photoelectric conversion medium 10 permits measurement and reading of information in vacuum in addition to multiple use with erasing recorded image information (charge distribution). Therefore, a high-resolution and excellent-operability optical detection apparatus can be provided. Also, in measuring the charge distribution, the positional resolution increases in the scanning plane of probe 20 as the measured region becomes smaller, which results in enhancing a resolution of obtained image. The tip end of probe 20 should be preferably made as acute as possible accordingly.

Figure 9:
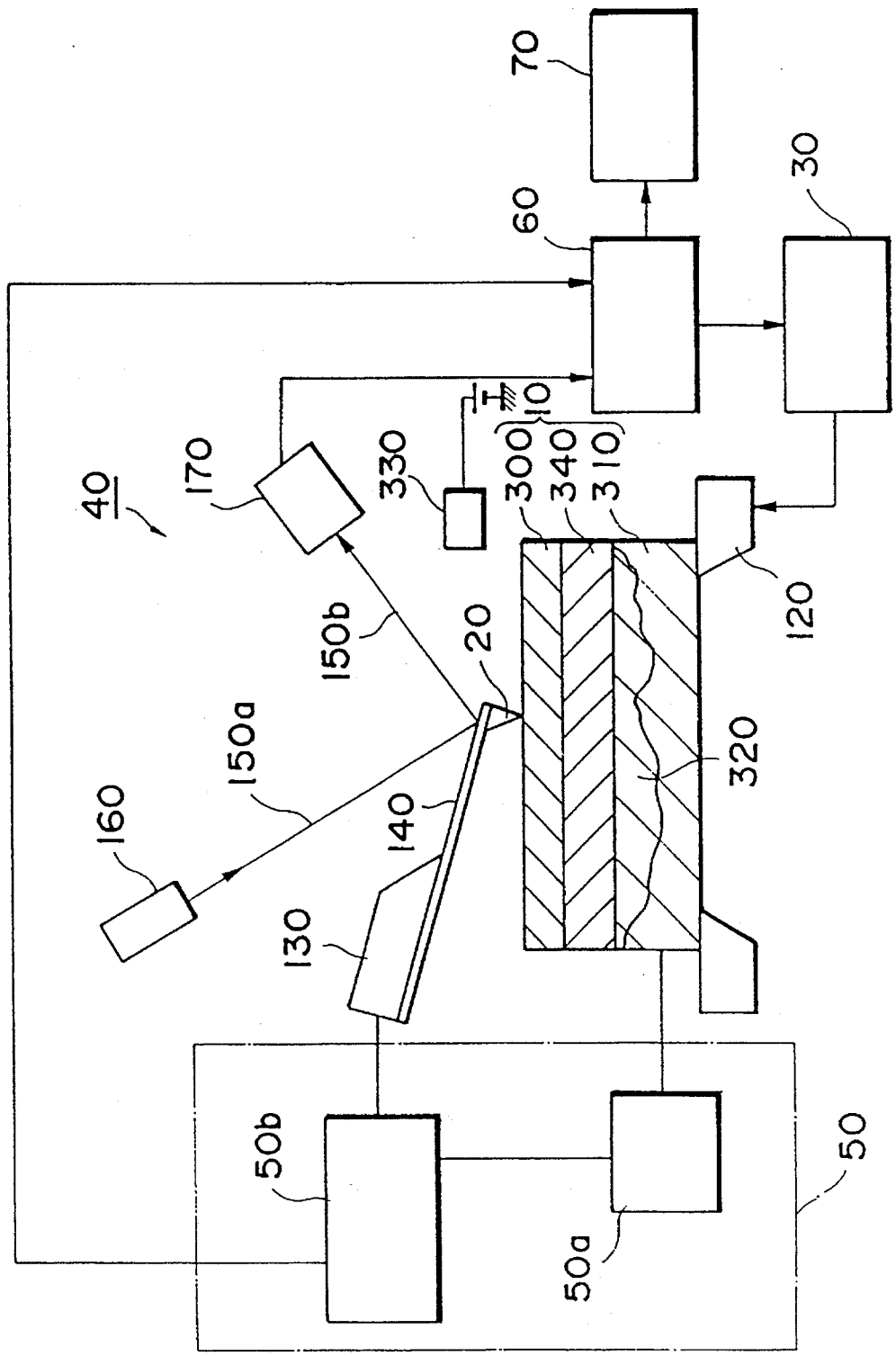
FIG. 9 is an explanatory drawing to show a more specific structure of the second embodiment of scanning optical detection apparatus.

Next described referring to FIG. 9 is a specific structure of the scanning optical detection apparatus in this embodiment. In FIG. 9, constituent elements identical or similar to those in FIG. 5 are denoted by the same reference numerals. Explaining major points, the photoelectric conversion medium 10 is produced by the semiconductor production technology, the charge storage layer 300 is made of silicon nitride (SiN), the insulating layer 340 of silicon oxide (SiO), and the auxiliary layer 310 of a p-type silicon semiconductor. The auxiliary layer 310 is not limited to the p-type silicon but may be another p-type semiconductor in the group IV of the periodic table such as germanium (Ge). When a high voltage is applied to the insulating layer 340, it causes the tunneling between the charge storage layer 300 and the auxiliary layer 310 to move electrons. In order-to assure the occurrence of tunneling, this embodiment is arranged such that the thickness of charge storage layer 300 is set in the range of from about 100 Å to 500 Å, the thickness of insulating layer 340 in the range of about 30 Å to 50 Å, and the thickness of auxiliary layer 310 in the range of about 0.3 mm to 0.5 mm, which is the same range for silicon wafer applied to ordinary semiconductor devices.

The photoelectric conversion medium 10 is set on a support stage (three-dimensional actuator) 120 movable in the X, Y, Z coordinate directions, and the support stage 120 is driven by scanning means 30 operated based on a command from the information processing and controlling means 60 to move in various directions. The probe 20 is fixed near the fore end of a plate spring-type cantilever 140 having elasticity. The tip end portion of probe 20 contacting with the charge storage layer 300 is finely formed for example in radius of curvature of about several ten nm. The voltage applying means 50a is provided for applying a predetermined voltage (about several ten volts) for initializing the photoelectric conversion medium 10 to between the charge storage layer 300 and the auxiliary layer 310 through the probe 20 thereby to keep the probe 20 in a positive potential. A capacitance meter 50b is electrically connected to the probe 20. The capacitance meter 50b measures a charge distribution in the charge storage layer 300 while the probe 20 scans the charge storage layer 300 in contact therewith. Then, the capacitance meter 50b sends the measurement result to the information processing and controlling means 60.

In scanning to measure the charge distribution, as described hereinafter, measurement light (spot laser beam) 150a from a light source 160 in urging means 40 is let to irradiate the reflective part, and reflected light 150b is received by light detecting means 170. Then the information processing and controlling means 60 calculates a deflection amount of cantilever 140 based on a detection output from the light detecting means 170, calculates a contact force (relatively urging force) between the probe 20 and the charge storage layer 300 in accordance with the deflection amount, and controls the scanning means 30 to finely adjust the position of support stage 120 in the Z-coordinate direction so as to keep constant the contact force between the probe 20 and the charge storage layer 300.

Further, there are disposed near the charge storage layer 300 of the photoelectric conversion medium 10, an electrode 330 set in a positive potential to capture the photoelectrons "e" and a current detection monitor 350 for detecting a current produced in the electrode 330 by the photoelectrons "e". The current detection monitor 350 detects a value of current upon incidence of measured-sample image (X-ray image) into the photoelectric conversion medium 10 thereby to analyze the so-called exposure condition. In more detail, the following adjustment is carried out. If the intensity of X-ray image is lower than the proper exposure condition, then the duration of incidence of X-ray image is lengthened; conversely, if the intensity of X-ray image is higher than the expected exposure condition, then the duration of incidence of X-ray image is shortened. The electrode 330 and the current detection monitor 350 are positioned as close to the charge storage layer 300 outside the region irradiated by the X-ray image as possible.

Next described is the operation of the scanning optical detection apparatus in this embodiment as so arranged.

The image pickup process is first explained. Light including information of desired image is let to irradiate the charge storage layer 300. The irradiating light is, for example, X-rays in case of X-ray microscope, which is focused by a focusing optical system after passing through a sample. Upon irradiation with the X-rays, the charge storage layer 300 emits photoelectrons "e" by the external photoelectric effect, and the thus emitted photoelectrons "e" are attracted to the positively charged electrode 330 then to be captured thereby (see FIG. 7). The probe 20 is withdrawn outside the image pickup region 320 upon irradiation of X-ray image, as shown. The emission of photoelectrons "e" accumulates positive charge in the charge storage layer 300. Since an amount of photoelectrons "e" emitted from the charge storage layer 300 is dependent on a light quantity (intensity) of irradiating X-rays, a distribution of positive charge is formed in the charge storage layer 300, corresponding to the intensity distribution of irradiating X-rays. The X-ray image is thus recorded as a distribution of positive charge formed in the charge storage layer 300.

In case that all irradiating X-rays are not absorbed by the charge storage layer 300, a part of X-rays pass through the charge storage layer 300 to reach the insulating layer 340 and the auxiliary layer 310. Then the insulating layer 340 and the auxiliary layer 310 could emit photoelectrons "e" by the external photoelectric effect and the thus emitted photoelectrons "e" could enter the charge storage layer 300. As X-rays advance through a material, they tend to be absorbed by the material to lower the intensity thereof. In addition, the charge storage layer 300 has a higher emission efficiency of photoelectrons than that of the auxiliary layer 310. Also, since the thickness of insulating layer 340 is thinner than that of charge storage layer 300, an amount of emitted photoelectrons is small. From such reasons, even if a part of X-rays reach the insulating layer 340 or the auxiliary layer 310, the positive charge is accumulated in the charge storage layer 300.

To read out the recorded image (picture image), the charge distribution formed in the charge storage layer 300 is measured. In the measurement of charge distribution, the controlling means 60 activates the relative movement between the photoelectric conversion medium 10 and the probe 20 so that the surface of charge storage layer 300 is two-dimensionally scanned by the probe 20 (in the XY directions). The positive charge accumulated in the charge storage layer 300 forms a depletion layer 320 in the auxiliary layer 310 near the border to the insulating layer 340. Since the thickness of depletion layer 320 is dependent on an amount of positive charge stored in the charge storage layer 300, it becomes thicker in a place with a larger charge amount, but it becomes thinner in a place with a smaller charge amount. Consequently, the distribution of thickness of depletion layer 320 will be determined corresponding to the charge distribution formed in the charge storage layer 300.

The capacitance meter 50b measures the thickness of depletion layer 320 in each measurement position in the charge storage layer 300 as an electrostatic capacitance between the probe 20 and the auxiliary layer 310, and outputs the measurement results to the controlling means 60. Since the measured electrostatic capacitance corresponds to the thickness of depletion layer 320, this measurement is thus equivalent to measuring the charge distribution formed in the charge storage layer 300. The controlling means 60 obtains a distribution of positive charge by making a correspondence between values of electrostatic charge received from the capacitance meter 50b and positions where the respective values were detected in the charge storage layer 300, and the controlling means 60 outputs the distribution to the display means to display it as an image (picture image) of sample by X-rays.

During measurement the probe displacement measuring system controls the cantilever 140 to keep the deflection amount thereof constant, so that the probe 20 may scan the charge storage layer 300 always at a constant pressure.

The image pickup device used in the present embodiment has a high resolution, and therefore images can be formed thereby without lowering the resolution of X-rays.

In order to erase the recorded image in the photoelectric conversion medium 10, the voltage applying means 50a applies a voltage of several ten volts to between the probe 20 and the auxiliary layer 310 with the probe 20 being positive. Since the recorded image can be stored in the charge storage layer 300 as long as such erasing operation is not carried out, image reading can be done at a different location from that of image recording.

Figure 10:
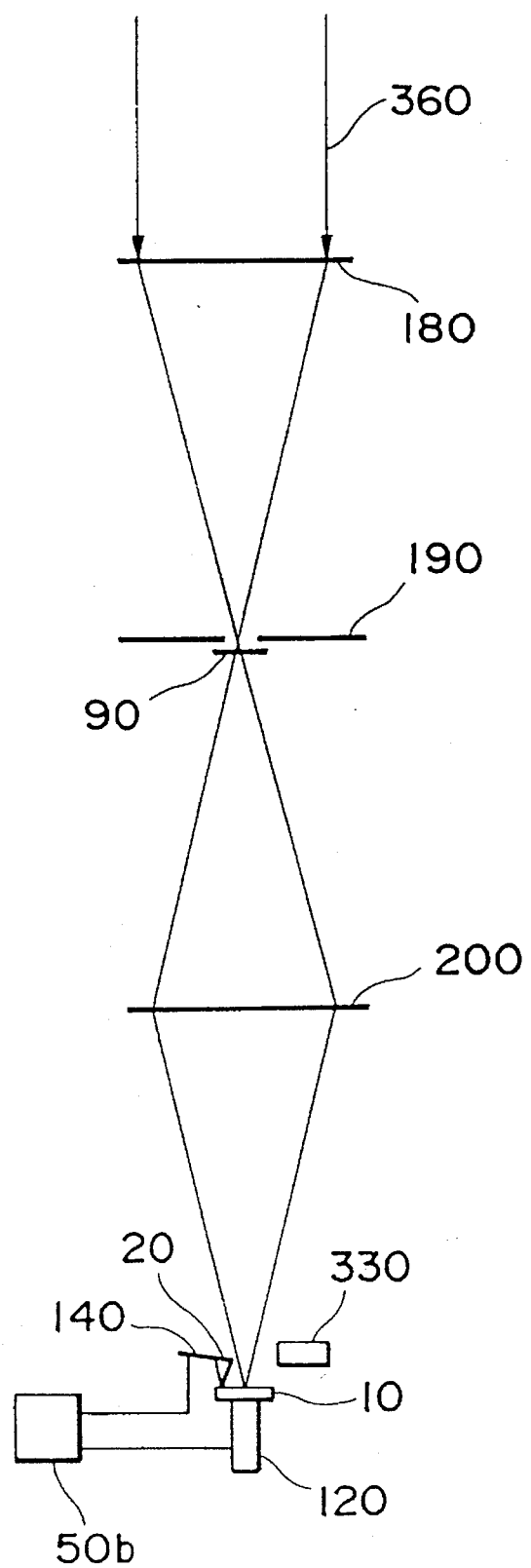
FIG. 10 is a constitutional drawing of an X-ray microscope to which the second embodiment of scanning optical detection apparatus is applied.

FIG. 10 is a schematic constitutional drawing to show an example of X-ray microscope to which the optical detection apparatus in this embodiment is applied. In FIG. 10, constituent elements having the same functions as those in FIG. 9 are denoted by the same reference numerals and omitted to explain in detail herein. The X-ray microscope has an X-ray optical system composed of a condenser optical system composed of a condenser optical element 180 for collecting X-rays 360 to irradiate a sample 90, and a stop (pin hole) 190, a focusing optical system 200 for focusing X-rays passing through the sample 90, and a photoelectric conversion medium 10 located at the focus position of the focusing optical system 200. These constituent elements are set in a vacuum receptacle (not shown).

Further, there is means provided in the vacuum receptacle, for recording or reading an image of the sample 90 in the photoelectric conversion medium 10, which comprises a cantilever 140 at the fore end of which a probe 20 is provided for scanning the surface of charge storage layer in the photoelectric conversion medium 10, a positively charged electrode 330 for capturing photoelectrons emitted from photoelectric conversion medium 10, a charge distribution measuring device 50b, and scanning means 120 for relatively moving the probe 20 and the photoelectric conversion medium 10. The charge distribution measuring device 50b is provided with an electrostatic capacitance meter for measuring an electrostatic capacitance between the probe 20 and the auxiliary layer in the photoelectric conversion medium 10, and display means (not shown) for displaying the charge distribution in the charge storage layer as an image of the sample 90 by making a correspondence between positions of probe 20 on the charge storage layer and measurement results at the positions by the capacitance meter.

In the X-ray microscope as so arranged, X-rays 360 are let to irradiate the sample 90 through the X-ray optical system and an X-ray image passing through the sample 90 is applied to impinge on the photoelectric conversion medium 10. Since the X-ray image of the sample 90 is recorded as a charge distribution in the photoelectric conversion medium 10, the image of the sample 90 can be observed by measuring this charge distribution, as described above. If the charge distribution measuring device 50b is set outside the vacuum receptacle, the image of the sample 90 can be observed without taking the photoelectric conversion medium 10 out of the vacuum receptacle. Such an arrangement can obviate a work for releasing the vacuum in the vacuum receptacle to observe the image and again evacuating the receptacle for next image pickup. Also, the recorded image can be erased while keeping the photoelectric conversion medium 10 inside the vacuum receptacle, which enables multiple image pickup. For example, different portions in the sample 90 can be observed by providing a mechanism for moving the sample 90.

Incidentally, the charge density in the SiN used in the charge storage layer in the present embodiment is about 10 particles per square nm. Therefore, 256 gradations can be realized in 26 square nm, enabling a pixel to be made in 5 nm×5 nm. Also, the resolving power of optical detection apparatus depends upon the shape of probe, and, therefore, a resolution of several ten nm can be achieved. This value of the resolution is about 60 dB higher than those by CCD or MCP conventionally used.

It is here preferable that the cantilever 140 is arranged to be operated (react) against a force acting between the probe 20 and the charge storage layer 300 (repulsive force: about $10^{-8}$ to $10^{-9}$N).

As by the arrangement employed in the present embodiment that the measurement light 150a is let to irradiate the reflective part of cantilever 140, the displacement of probe 20 can be detected by another arrangement, for example by an arrangement that irradiation light onto the cantilever 140 and reflected light therefrom are made to interfere with each other to measure the displacement of probe 20, or by an arrangement that a probe of STM (scanning tunneling microscope) is set on the back surface of cantilever 140 and a tunnel current between the probe 20 of STM and the cantilever 140 is measured to detect the displacement of probe 20.

In case that the surface of charge storage layer 300 is sufficiently smooth, the aforementioned probe displacement measuring system can be omitted by setting the spring constant (elastic coefficient) of cantilever 140 to a small value to provide the cantilever 140 with sufficient elasticity. If the cantilever 140 has a desired force of restitution upon contact between the probe 20 and the charge storage layer 300 in measuring the charge distribution, the probe 20 can scan the surface of charge storage layer 300 under a constant pressure.

Embodiment 3

Figure 11:
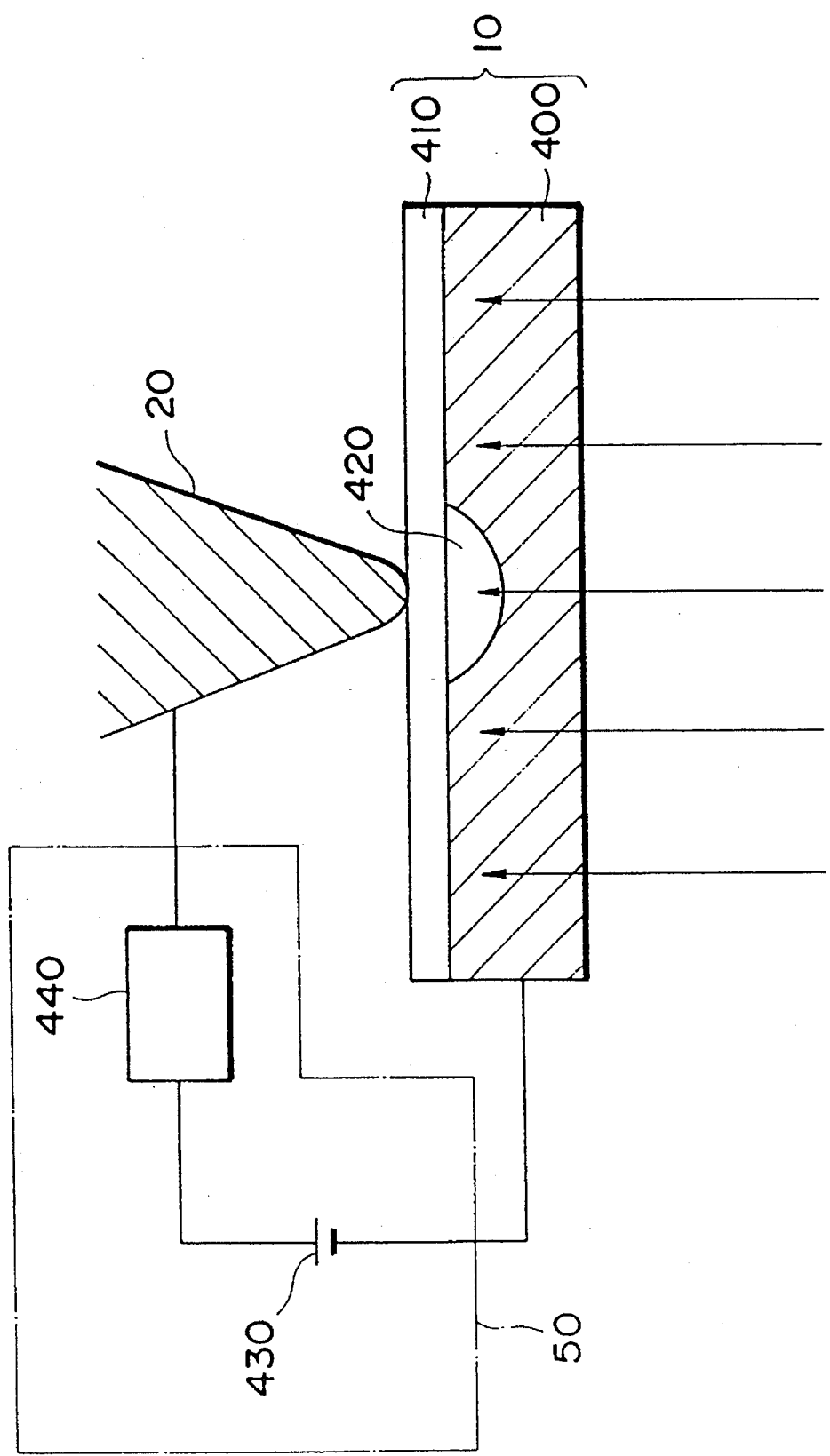
FIG. 11 is a vertical cross section to show the construction and a read function of a photoelectric conversion medium employed in the third embodiment.

The third embodiment will be described with reference to FIG. 11 to FIG. 13. In the third embodiment the general construction of scanning optical detection apparatus is the same as that in the first embodiment shown in FIG. 1. In more detail, the apparatus comprises a probe for scanning the surface of photoelectric conversion medium made of a semiconductor, moving means for moving the probe on the medium to scan the photoelectric conversion medium in contact therewith, voltage applying means for applying a voltage to between the probe and the photoelectric conversion medium, current measuring means for measuring a value of current to be detected between the probe and the photoelectric conversion medium, and information processing and controlling means for obtaining a distribution of current value for the photoelectric conversion medium by making a correspondence between positions of probe on the photoelectric conversion medium and current values measured by the current measuring means at the respective positions.

Further, a detection method comprises a step of applying a predetermined voltage to between a photoelectric conversion medium made of a semiconductor and a probe for scanning the surface of medium, a step of guiding light having desired information onto the photoelectric conversion medium, a step of scanning by the probe a region irradiated by the light in the photoelectric conversion medium, and measuring a value of a current flowing between the probe and the photoelectric conversion medium at an arbitrary position of the probe on the photoelectric conversion medium, and a step of obtaining a distribution of current value for the medium by making a correspondence between positional information data each representing a position of the probe and current values measured at the positions.

The third embodiment is so arranged that an intensity distribution of light irradiating the photoelectric conversion medium is obtained by measuring a current flowing between the photoelectric conversion medium and the probe thereby to obtain information (image) included in the light, as described above, which is different from the first and second embodiments which are arranged to obtain a charge distribution. The principle of the third embodiment is further described referring to FIG. 11.

The photoelectric conversion medium 10 has a semiconductor layer 400 made of a p-type semiconductor and a very thin oxide layer 410 formed such that the surface of layer 400 is naturally oxidized in the air. While the probe 20 is made in contact with the surface of oxide layer 410, the voltage applying means 430 applies a voltage to make the probe 20 positive and the layer 400 negative, whereby a depletion layer 420 is formed in the vicinity of the probe 20 in the layer 400. When in this state incident light (which could be light in the wavelength range of from visible light to gamma-ray region) is let to irradiate the surface of layer 400 on the side opposite to the surface with which the probe 20 is in contact, electrons in the material forming the layer 400 absorbs the light in the depletion layer 420 to be excited in the conduction band of layer 400. The thus excited electrons pass through the oxide layer 410 because of the tunneling effect by an electric field formed between the probe 20 and the layer 400, and then flow into the probe 20. That is, when the incident light starts irradiating a portion where the depletion layer 420 is formed in the photoelectric conversion medium 10, a current flows between the probe 20 and the photoelectric conversion medium 10. The amplitude of current flowing between the probe 20 and the photoelectric conversion medium 10 is proportional to an intensity of the irradiating light. Thus, the higher the intensity the larger the current. Consequently, if the current flowing between the probe 20 and the photoelectric conversion medium 10 is measured by the current measuring means (ammeter) 440, the intensity of irradiating light can be obtained based on the measurement result. On the other hand, if the incident light irradiates a portion in which there is no depletion layer 420 formed, thereby to excite electrons therein, the electrons are combined with holes in the layer 400 made of a p-type semiconductor at once and, therefore, no current (tunnel current) flows between the probe 20 and the photoelectric conversion medium 10. In summary, the intensity of irradiating light can be measured only at the portion in which the depletion layer 420 is formed in the vicinity of the contact portion with the probe 20. The depletion layer 420 moves to follow up the probe 20 when the probe 20 moves on the surface of oxide layer 410. Then an intensity distribution can be obtained for the incident light irradiating the photoelectric conversion medium 10, if the probe 20 scans the oxide layer 410 in contact therewith in the irradiated region in the layer 400 to measure scanning positions of probe 20 and amplitudes of the current thereat. Since the intensity distribution of irradiating light depends upon the information (image) included in the incident light, the thus obtained intensity distribution can be equivalent to an image pickup result. Accordingly, an objective image can be observed immediately without development as required for photographic films. For example in an X-ray microscope, when an X-ray image passing through a sample is let to irradiate the photoelectric conversion medium 10, the X-ray image has different intensities depending upon a portion where the X-ray image passes through the sample. Therefore, an image of sample can be obtained by obtaining an intensity distribution of irradiating X-ray image and displaying it.

The region (area) of depletion layer formed in the layer 400 depends upon the radius of the tip portion of probe 20 (degree of acuteness of the tip). In other words, the region becomes broader as the radius of the tip portion of probe 20 increases; it becomes narrower as the radius decreases. The tip portion of probe 20 can be made in radius of 0.01 to 0.1 μm. In this case, the region (area) in which the depletion layer 420 is formed is about 0.02 to 0.5 μm. Then, if according to the radius of the tip of probe 20 a pitch of measuring points where a current is measured is determined in correspondence to the region where the depletion layer 420 is formed, the light intensity distribution can be obtained at a high accuracy, for example at the spatial resolution of not more than 1 μm. If a higher resolution is required, the region where the depletion layer 420 is formed may be made smaller by using a probe 20 having a tip portion of smaller (acuter) radius, and in scanning, measuring points may be set at a smaller pitch to measure the current flowing between the probe 20 and the photoelectric conversion medium 10. The measurement (image pickup) can be done with high accuracy. In contrast, if a high resolution is not required contrary to the above case, the regions-where the depletion layer 420 is formed may be made larger by increasing the radius of the tip portion of probe 20 and the pitch of measuring points may be increased. In this case, the measuring speed can be increased. As described, the spatial resolution can be changed for the image included in "light irradiating the photoelectric conversion medium" by properly selecting one from probes 20 having different radii of tip portion. The size of the region where the depletion layer 420 is formed can be also changed by changing a carrier density in the layer 400. The higher the carrier density the smaller the region where the depletion layer 420 is formed; the lower the carrier density the larger the region. The region where the depletion layer 420 is formed also changes depending upon a voltage applied to between the probe 20 and the photoelectric conversion medium 10. In this case, the higher the voltage the larger the region; the lower the voltage the smaller the region. As described, the spatial resolution in image pickup can be adjusted in this embodiment by changing the radius of tip portion of probe 20, the carrier density in the layer 400, or the voltage applied to between the probe 20 and the photoelectric conversion medium 10.

An image pickup region in the photoelectric conversion medium 10 (region where the intensity distribution of light can be obtained) is determined by the region in which the probe 20 scans the surface of photoelectric conversion medium 10. Thus, properly setting the scanning region of probe 20, an image pickup result can be obtained in an arbitrary portion. In more detail, a desired region may be selected in the region illuminated by light to obtain an intensity distribution of the light in the region.

The probe 20 is always made in slight contact with the surface of photoelectric conversion medium 10 in scanning thereof, so that the current may be measured with accuracy and then the light intensity distribution may be obtained with improved accuracy. It suffices for that purpose that the probe 20 is provided on support means made of an elastic material. In this case, the elastic constant should be preferably set as low as possible to avoid abrasion of contacting portions between the probe 20 and the photoelectric conversion medium 10 upon scanning. Such a supporting method of probe 20 may be realized by using a micro cantilever in which a probe 20 and a support (lever) supporting the probe are integrally formed, for example one used for atomic force microscope (AFM). This cantilever can be produced by the photolithography technology employed in semiconductor production. This supporting method can keep the probe 20 in contact with the surface of photoelectric conversion medium 10 always by a weak force during scanning of probe 20.

This photoelectric conversion medium 10 can be used any times without erasure.

Figure 12:
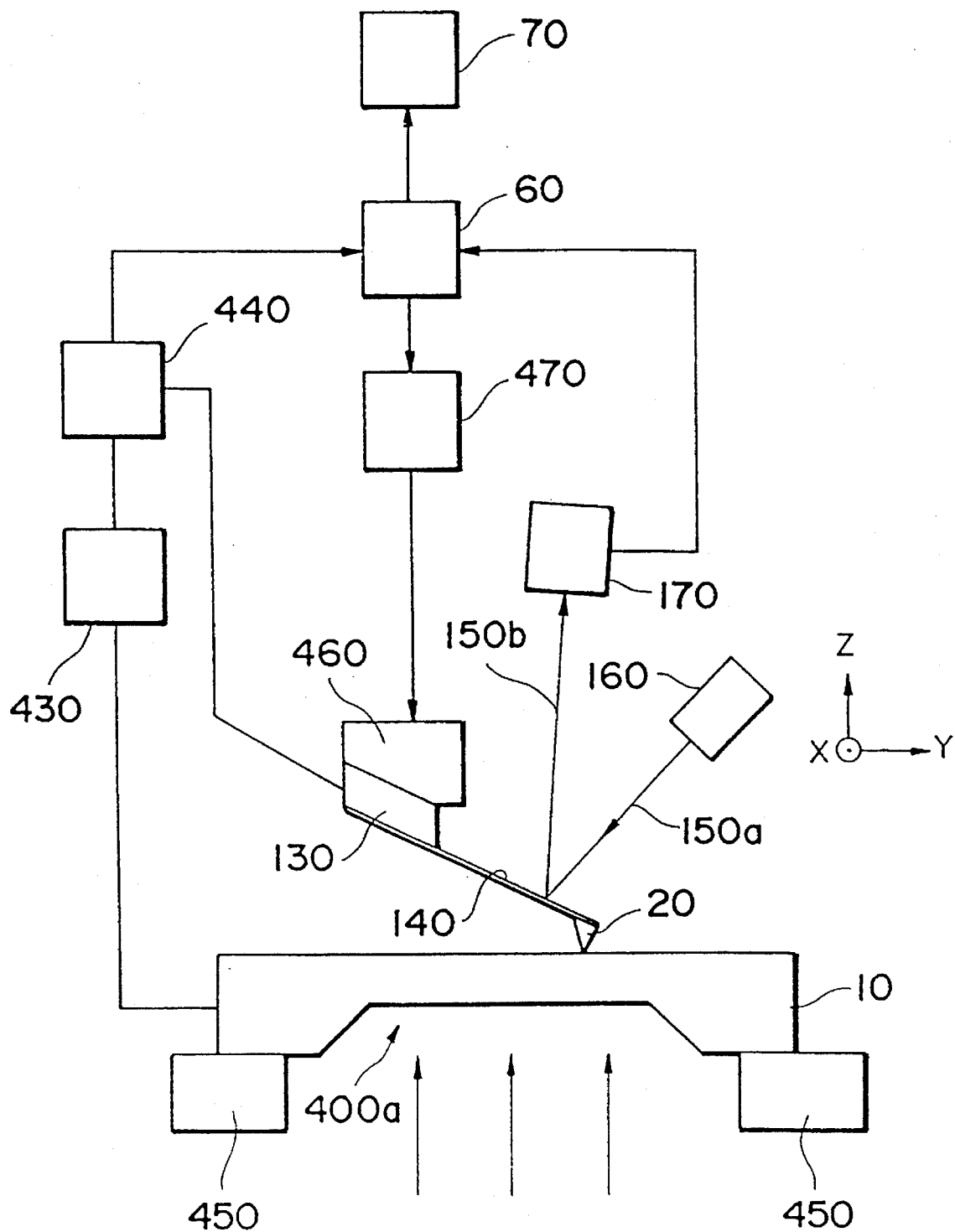
FIG. 12 is an explanatory drawing to show a more specific structure of the third embodiment of scanning optical detection apparatus.
Figure 13:
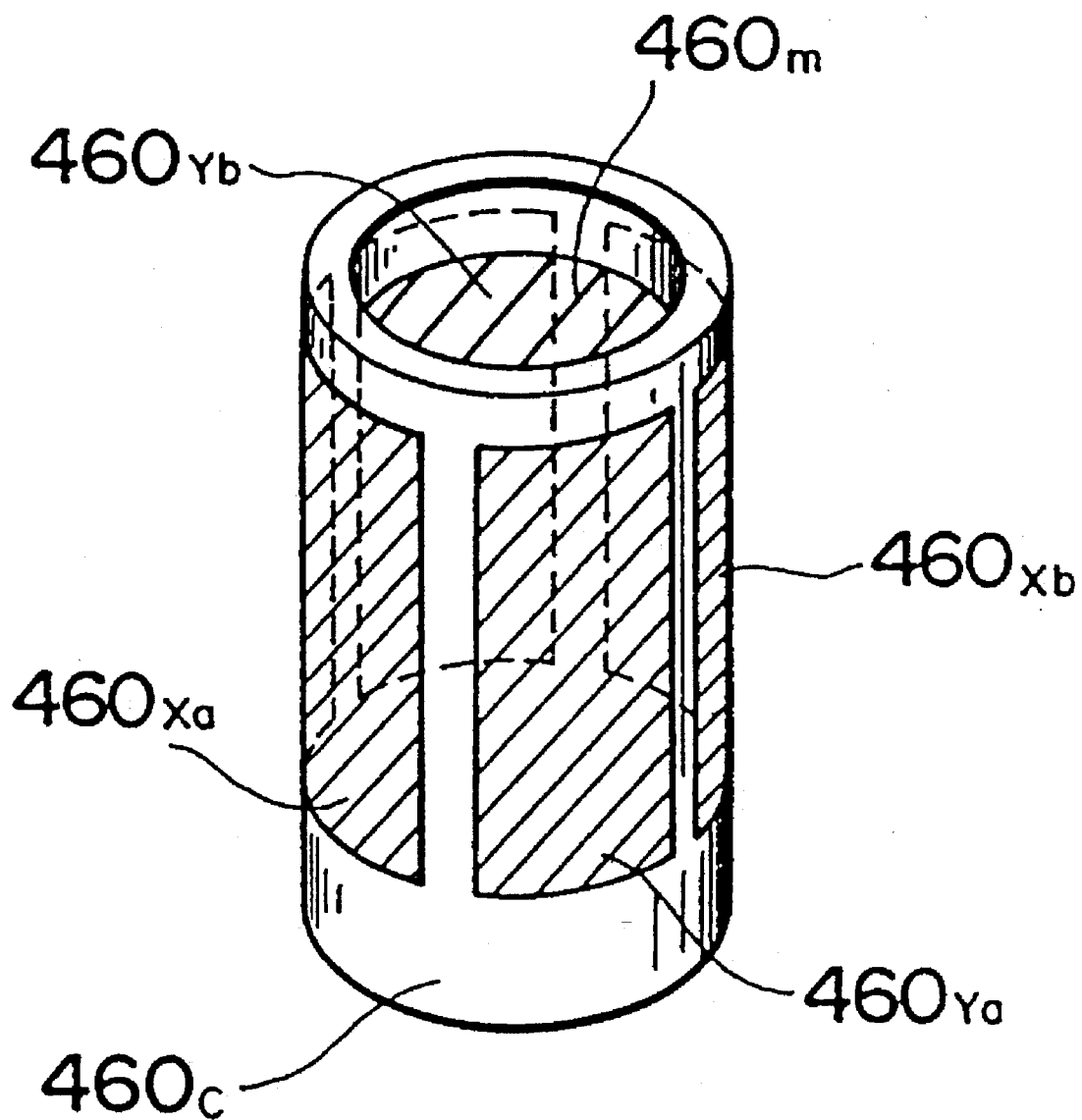
FIG. 13 is an explanatory drawing to show the construction of an actuator employed in all embodiments.

Next described referring to FIG. 12 is a specific structure of the scanning optical detection apparatus in this embodiment. In FIG. 12, constituent elements identical or similar to those in the first embodiment shown in FIG. 5 and those in the second embodiment shown in FIG. 9 are denoted by the same reference numerals. The apparatus has a holder 450 on which the photoelectric conversion medium 10 is mounted, a plate spring type cantilever 140 fixed to a support parts 130, a conductive probe 20 set at the fore end of the cantilever 140, voltage applying means 430 for applying a voltage to between the photoelectric conversion medium 10 and the probe 20, current measuring means 440 for measuring an amplitude of a current flowing between the optical photoelectric conversion medium 10 and the probe 20, a PZT actuator 460 for moving the probe 20 in the X, Y, Z directions, information processing and controlling means 60 for drive-controlling the PZT actuator 460 in predetermined directions and obtaining an intensity distribution of the light image irradiating the photoelectric conversion medium 10 by making a correspondence between positions of probe 20 (measured portions) on the photoelectric conversion medium and measurement results measured by the current measuring means 440 at the respective positions, and display means for displaying the intensity distribution obtained by the information processing and controlling means 60 as an image included in the light image.

The photoelectric conversion medium 10 is made of a p-type silicon semiconductor with resistivity of 0.01 to 100 Ωcm, which is made by etching such that a receiving surface of the light image (image pickup region in layer 400) 400a has an area of 9 mm$^2$ and a thickness of 3 μm. The photoelectric conversion medium 10 is mounted on the holder 450 with a smooth surface thereof (oxide layer 410) on the probe 20 side. The cantilever 140 and the probe 20 provided at the fore end thereof are produced by the lithography technology. The cantilever 140 has a length of 300 μm and a spring constant of 0.1 N/m. The probe 20 is produced with a tip portion in radius of 0.01 to 0.1 μm. The cantilever 140 is fixed to the PZT (piezo-electric transducer) actuator 460 through a lever support (not shown). The actuator 460 may be constructed for example in the arrangement as called as a tube scanner type as shown in FIG. 13. The actuator of tube scanner type is so arranged that on the outer circumferential surface of cylindrical piezo-electric ceramic 460c there are electrodes $460_{xa}$, $460_{xb}$ for X-scan piezo-electric elements and electrodes $460_{ya}$, $460_{yb}$ for Y-scan piezo-electric elements respectively opposing to each other in the X direction and in the Y direction. A common electrode $460_m$ is provided to the electrodes $460_{xa}$, $460_{xb}$, $460_{ya}$, $460_{yb}$ on the inner circumferential surface of piezo-electric ceramic. For scan in the X or Y direction, a voltage is applied to between X or Y electrodes and the common electrode $460_m$. For scan in the Z direction, using the both X, Y piezo-electric elements, either positive or negative voltage is applied to the mutually opposing electrodes between the XY electrodes and the common electrode $460_m$ to make the piezo-electric elements expand or contract in the Z direction. In the present embodiment, using such PZT actuator 460, the probe 20 can be moved to scan an arbitrary region in the region 400a in the photoelectric conversion medium 10 irradiated by the incident light image.

Also, a probe displacement measuring system is provided for measuring an amount of deflection of cantilever 140 (displacement of probe 20). This probe displacement measuring system is used when the probe 20 is made to come into contact with the surface of photoelectric conversion medium 10 under a constant pressure. The probe displacement measuring system is composed of a light source 160 for radiating measurement light 150a toward a reflective part disposed in the vicinity of probe 20 on the cantilever 140, light detecting means 170 for detecting the measurement light 150b reflected by the reflective part, and Z-direction controlling means 470 for detecting an amount of deflection of cantilever 140 from an output from the light detecting means 170 and driving the PZT actuator 460 in the Z direction through the information processing and controlling means 60 so as to keep the amount of deflection at a certain level (or to keep the output from the light detecting means 170 at a certain value). The probe displacement measuring system preferably has a resolution of subnanometer order. In addition to the arrangement employed in the present embodiment that the measurement light 150a is let to irradiate the reflective part of cantilever 140, alternative measuring system can be formed as an arrangement that irradiation light to the reflective part and reflected light therefrom is made to interfere with each other thereby to measure a displacement of probe 20, or an arrangement that a probe of STM (scanning tunneling microscope) is positioned on the back surface of cantilever 140 and a tunnel current flowing between the probe of STM and the cantilever 140 is measured to measure the displacement of probe. Such probe displacement measuring system can be omitted if the probe 20 is arranged to be kept in contact with the surface of photoelectric conversion medium 10 always at a constant force during measurement (image pickup).

Next described is the measurement (image pickup) process using the present embodiment. First, the photoelectric conversion medium 10 is mounted on the holder 450 such that a smooth surface thereof is set on the probe 20 side. The probe 20 is kept in contact with the surface of photoelectric conversion medium 10. In that occasion, the actuator 460 is driven to move the cantilever 140 in the Z direction, whether the prove 20 comes to contact with the photoelectric conversion medium 10 is detected by the probe displacement measuring system, and the cantilever 140 is further moved by 5 μm from the contact position to the photoelectric conversion medium 10 (in the Z direction). Then the force acting between the probe 20 and the medium 10 is about 0.5 μN (micronewton). When the probe 20 is made to scan the medium 10 in this state, the probe 20 is kept in contact with the photoelectric conversion medium 10, free of the influence of drift or the like. After checking it, the light source 160 in the probe displacement measuring system is unlighted to stop irradiation of measurement light 150a, preventing the measurement light 150a from influencing the image pickup as noises.

Then the incident light image including information (image) is let to irradiate the photoelectric conversion medium 10 on the side thereof Opposite to the surface with which the probe 20 is in contact. The incident light image is for example one focused by a focusing optical system after passing through a sample in X-ray microscope. The voltage applying means 430 applies a voltage of 1 to 3 V to between the probe 20 and the medium 10 under irradiation of incident light image, and according to a command from the information processing and controlling means 60 the actuator 460 is driven to move the cantilever 140 in the X, Y coordinate directions, whereby the probe 20 mounted at the fore end of the cantilever 140 is let to two-dimensionally scan the medium 10. The scanning range of probe 20 is determined by the information processing and controlling means 60. Based on the set range, the PZT actuator 460 move the cantilever 140 to let the probe 20 scan a desired range. In the present embodiment the probe displacement measuring system controls the deflection amount of cantilever 140 so that the probe 20 can scan the medium 10 always at a constant force. The current measuring means 440 measures a current flowing between the probe 20 and the medium 10 at each preliminarily set measurement position to output the measurement result to the information processing and controlling means 60. The information processing and controlling means 60 obtains an intensity distribution of the light image irradiating the medium 20 from the current values received from the current measuring means 440 and the positions of probe 20 where each value was measured on the medium 10, to output the result to the display means 70. The display means 70 displays the light intensity distribution sent from the information processing and controlling means 60 as information (image) included in the light image. In the present embodiment, the radius of tip of probe 20 is 0.01 to 0.1 μm and a voltage of 1 to 3 V is applied to between the probe 20 and the medium 10. Then the region (area) of the depletion layer 420 formed in the layer 400 in the medium 10 is about 0.02 to 0.5 μm. If by the information processing and controlling means 60 the pitch of measuring points where a current flowing between the probe 20 and the medium 10 is measured is set corresponding to the region where the depletion layer 420 is formed, the intensity distribution of the light image can be obtained with a spatial resolution of not more than 1 μm.

A scan speed and a scan range of probe 20 are set by changing frequency and amplitude of scanning signals (triangular waves) input into a drive power source (not shown) for PZT actuator 460 as the moving means. Applying a certain voltage as bias voltage to the scanning signals, the measurement (image pickup) can be done in a desired range in the region irradiated by the incident light image.

Since the scanning optical detection apparatus in the present invention has a high resolution, for example in case of the optical detection apparatus being used as an image pickup device for X-ray microscope, an image can be obtained without lowering the resolution of X-rays.

As described above, the present embodiment permits precise observation of light intensity distribution in the irradiated region even if the irradiated region is as small as several microns. Thus, the present embodiment can provide high-resolution optical detection means. Also, since the present embodiment requires no development process as required for photographic films, an objective image can be observed immediately.

Further, in case that the apparatus is used as an image pickup device for X-ray microscope, the magnification of optical elements used in X-ray optical system can be set low. This shortens the length of X-ray optical system, enabling size reduction of the entire microscope.

Embodiment 4

Figure 14:
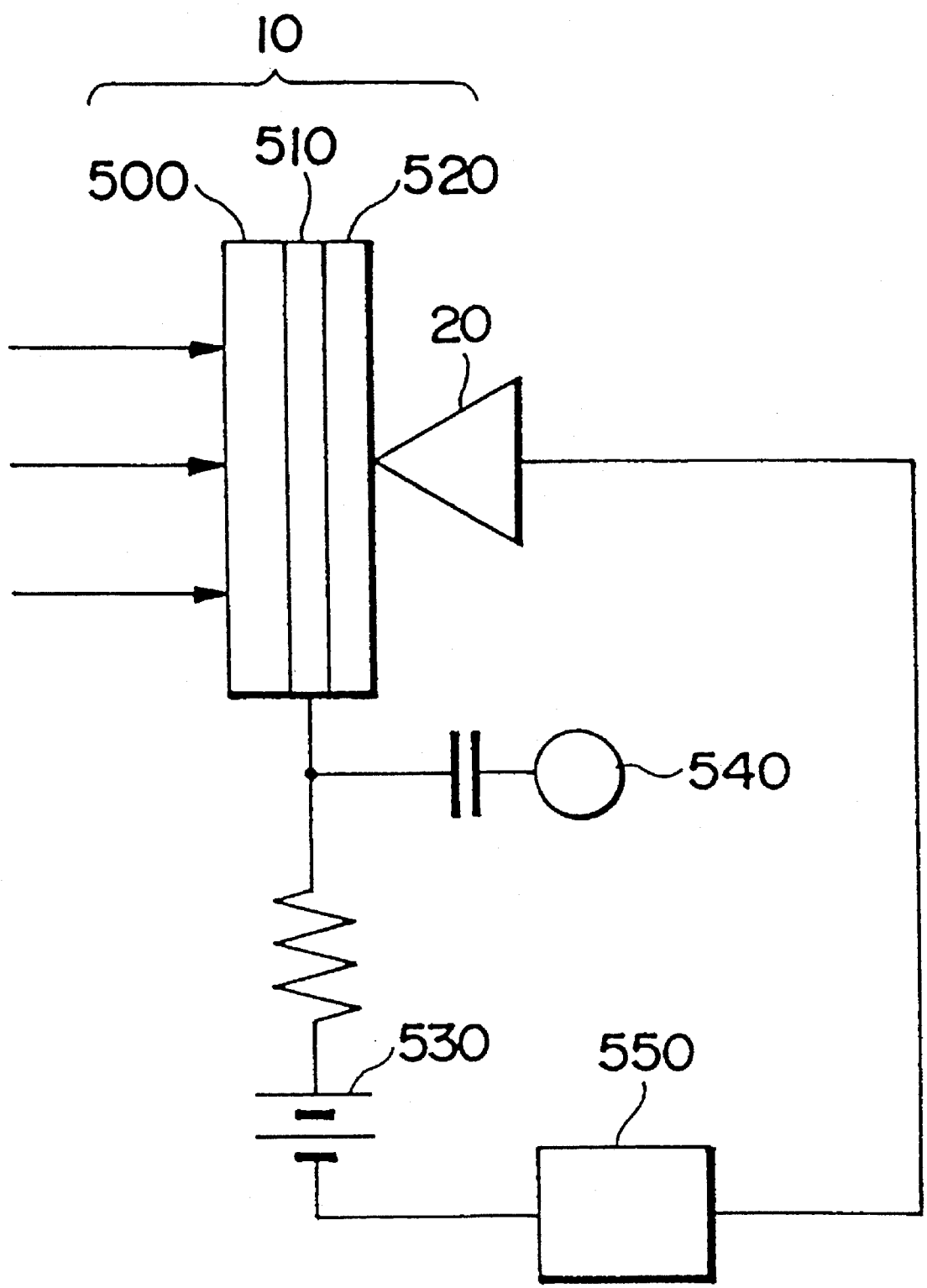
FIG. 14 is a vertical cross section to show the construction and a read function of a photoelectric conversion medium employed in all embodiments.
Figure 15:
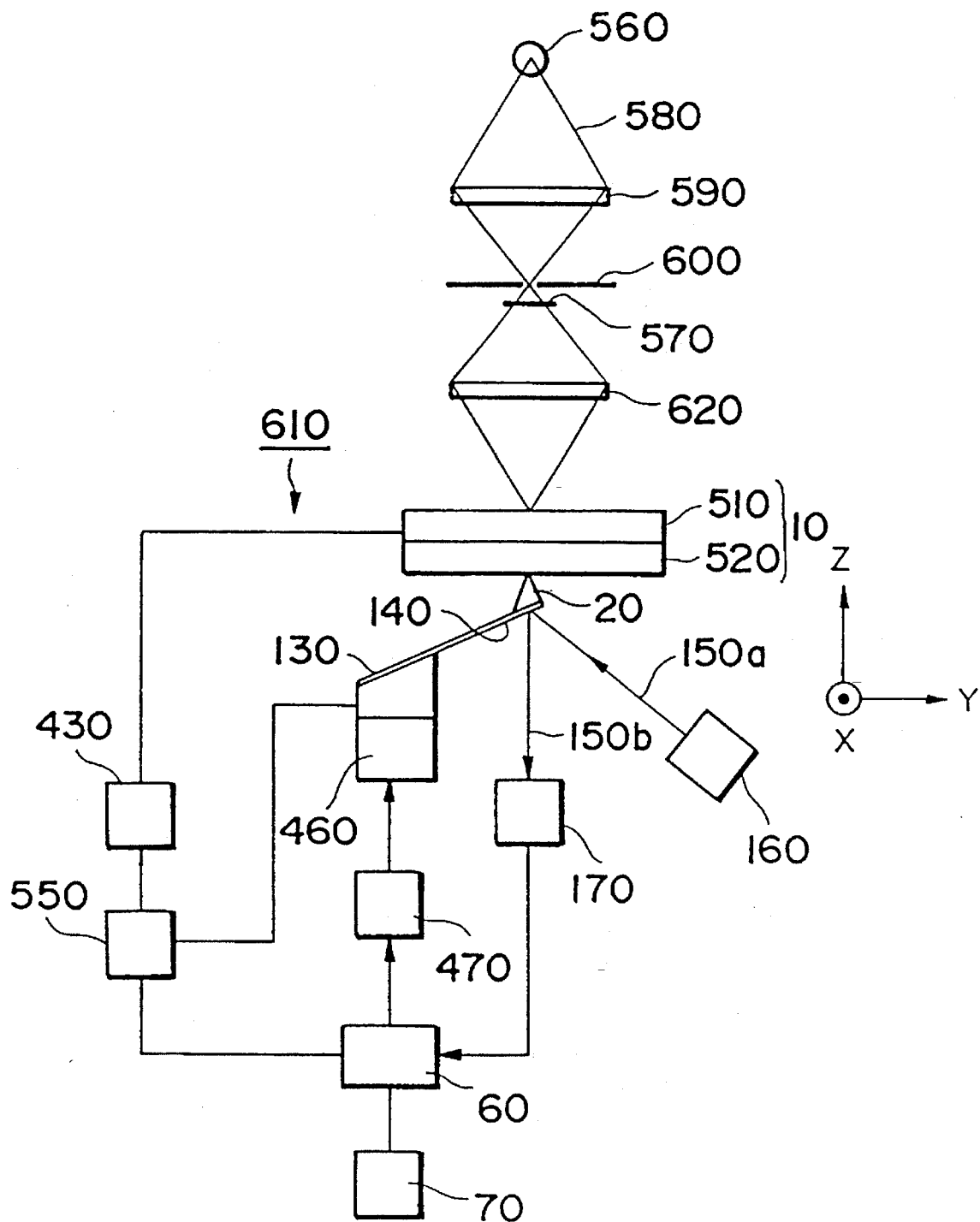
FIG. 15 is an explanatory drawing to show a more specific structure of the fourth embodiment of scanning optical detection apparatus.
Figure 16:
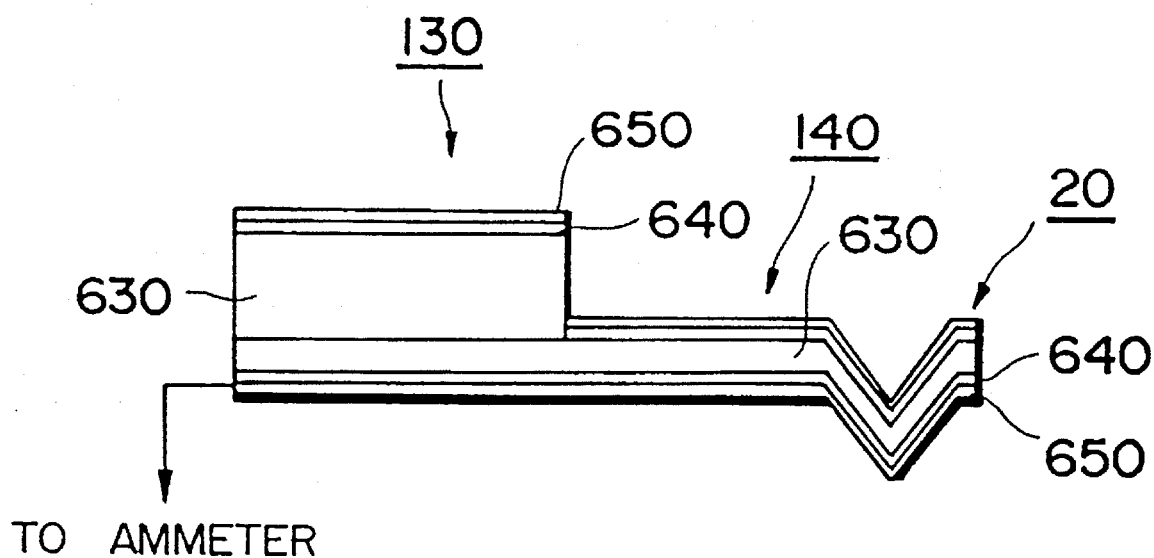
FIG. 16 is a vertical cross section to show the construction of a cantilever integral with a probe, which is employed in the fourth embodiment.

The fourth embodiment will be next described referring to FIG. 14 to FIG. 16. The general construction of the scanning optical detection apparatus in the fourth embodiment is the same as that in the first embodiment shown in FIG. 1.

In the fourth embodiment, the scanning optical detection apparatus has a photoelectric conversion medium having a transparent electrode and a photoconductive layer formed on the electrode, a conductive probe, scanning means for moving the probe to scan the photoconductive layer in the state that the probe is in contact with the photoconductive layer in the photoelectric conversion medium, current measuring means for measuring a current flowing between the transparent electrode and the probe, and intensity distribution detecting means for obtaining an intensity distribution of incident light image irradiating the photoelectric conversion medium, based on positions of the probe on the photoelectric conversion medium and values of current flowing between the transparent electrode and the probe at the positions where the current measuring means measured the current. Also, to maintain at a predetermined value the contact force between the probe and the photoconductive layer upon scanning of probe, the probe is set on a conductive and flexible member and there are provided light source means for radiating light onto the flexible member, light detecting means for receiving the light reflected by the flexible member and moving means for moving the flexible member in the direction of photoelectric conversion medium.

In the present embodiment, the conductive and sharp probe scans the photoconductive layer in contact therewith in reading the incident light image in the wavelength range of from the infrared region to the gamma-ray region. Then a current (or voltage) flowing between the probe and the layer is measured, and an intensity distribution of incident light image is obtained as the incident light image (picture image) from measured values and measurement positions.

The principal features of the fourth embodiment are the structure and the function of the photoelectric conversion medium as described above.

In this embodiment, the spatial resolution depends upon the radius of tip end of probe. The probe can be produced employing the probe production technology for atomic force microscope (AFM), whereby the radius of tip end of probe can be made in the range of 0.01 to 0.1 μm. Thus, the optical detection apparatus in the present embodiment can obtain a spatial resolution in submicron order. Next described in detail with FIG. 14 is the structure and the function of photoelectric conversion medium 10 employed in this embodiment.

The photoelectric conversion medium 10 is composed of a face plate 500 having a sufficient transmittance to the incident light image in the wavelength range to be observed, a transparent electrode 510 formed on one surface of the plate 500, and a layer (photoconductive layer) 520 formed on the electrode 510 and made of a photoconductive material. Before measurement (image pickup), a positive voltage is first applied to the transparent electrode 510 by the voltage applying means 530. The voltage is applied by the voltage applying means 530 so that the probe 20 has a negative potential with respect to the transparent electrode 510. The probe 20 is let to scan the surface of photoconductive layer 520 in contact therewith. By this, electrons are injected into the surface of photoconductive layer 520 to produce a potential difference between the two surfaces of photoconductive layer 520 (surface on the transparent electrode 510 side and surface on the probe 20 side). When the light image is let to irradiate in that state on the face plate 500 side, the internal photoelectric effect occurs in the photoconductive layer 520 with absorbing light, whereby movable electrons and holes are formed therein. The electrons move in the photoconductive layer 520 then to enter the transparent electrode 510. On the other hand, the holes move to the side opposite to the transparent electrode 510 then to be combined with electrons on the surface of photoconductive layer 520. This results in discharging the charge on the surface of the photoconductive layer 520 on the probe side. Further continuous incidence of incident light image causes the discharge amount to increase, whereby the potential increases.

In this state, when the probe 20 is again let to scan the surface of photoconductive layer 520 in contact therewith while it is kept in the negative potential relative to the transparent electrode 510 by the voltage applying means 530, electrons are injected into the photoconductive layer 520 through the probe 20 in portions corresponding to discharged locations in the photoconductive layer 520. Then a current flows in a capacitor formed by the transparent electrode 510 and the probe 20. This current drops a voltage detected at a signal output terminal 540. The value of current measured by the current measuring means 550 or a drop amount of voltage measured at the signal output terminal 540 is proportional to an amount of charge injected into the surface of photoconductive layer 520. The larger the charge amount discharged by irradiation of the light image the greater the current value or the drop amount; the smaller the discharged charge the smaller the current value or the drop amount. Accordingly, measuring at least one of current value and voltage drop amount (which will be called as "measurement value"), the intensity can be determined for the light image incident into the medium in the vicinity of the contact position. Then, an intensity distribution of the light image can be obtained such that the probe 20 is let to scan the photoconductive layer 520 in contact therewith under irradiation of incident light image and that a correspondence is made between contact points of probe 20 with the photoconductive layer 520 and measurement values measured at the respective contact points. This intensity distribution corresponds to information (image) included in the light image into the photoelectric conversion medium 10.

The structure and the material for the photoelectric conversion medium 10 may be those employed for photoconductive pickup tube such as vidicon. They may be determined suitably according to the wavelength of light image. The negative charge accumulated on the surface of the photoconductive layer 520 tends to spread, which will cause no problem in particular if a micro electrode is scanned at a speed of video rate (1/30 seconds/screen).

Next described with FIG. 15 is a specific apparatus to which the photoelectric conversion medium 10 is applied. This embodiment is an example of application to the X-ray microscope. In FIG. 15, constituent elements identical or similar to those in FIG. 12 are denoted by the same reference numerals. The apparatus has an X-ray source 560, a sample holder 570 for holding a sample (not shown), an optical condenser zone plate 590 for collecting X-rays 580 emitted from the X-ray source 560 onto the sample, a pin hole 600 disposed between the illumination zone plate 590 and the sample holder 570, image pickup means 610, and a focusing zone plate 620 for converging (focusing) the X-ray image passing through the sample on the image pickup means 610. Also, the apparatus is provided with a vacuum receptacle and evacuating means (which are not shown) for maintaining a path of X-rays 580 at a certain degree of vacuum.

The image pickup means 610 is composed of a photoelectric conversion medium 10, a probe 20, a Cantilever 140 with flexibility provided with a probe 20 at the fore end thereof, an actuator 460, voltage applying means 430, current measuring means 550, controlling means 60 and display means 70. Since the present embodiment is for picking up an image included in the X-rays, the photoelectric conversion medium 10 is arranged suitable for X-rays.

The photoelectric conversion medium 10 includes a Be (beryllium) plate 510 in thickness of 0.3 mm and a photoconductive layer 520 of PbO (lead monoxide) vapor-deposited on the Be plate 510. The thickness of photoconductive layer 520 is preferably in the range of 0.1 to 1 $\mu$m. PbO may be replaced by antimony trisulfide, cadmium selenide, silicon or amorphous selenium. The Be plate 510 is a metal transmitting X-rays, which has two functions as the face plate 500 and as the transparent electrode 510 in the photoelectric conversion medium 10 in FIG. 14. Aluminum may also be used instead of Be (beryllium). The photoelectric conversion medium 10 is set such that the Be plate 510 is located on the incidence side of X-ray image.

The probe 20 and the cantilever 140 are integrally formed as shown in the cross section of FIG. 16. The probe 20 and the cantilever 140 is constituted by a core body 630 made of Silicon material of the support parts 130, a layer 640 made of a NiCr alloy formed in thickness of 1 nm on the surface of the core body 630, and a layer 650 of Au formed in thickness of 3.90 nm on the NiCr alloy film 640. The core body 630 is produced using the lithography technology. The core body 630 may be made of $SiO_2$ (silicon dioxide) replacing SiN. Since the NiCr alloy layer 640 is provided for enhancing the adhesion between the core body 630 and the Au layer 650, it can be omitted if a conductive material having a good adhesion to the core body 630 is employed. The NiCr alloy layer 640 and the Au layer 650 both are formed by the vapor deposition method. The cantilever 140 is formed in length of about 200 $\mu$m and with spring constant of 0.1 N/m. Also, the probe 20 is formed with radius of tip end being in the range of 0.01 to 0.1 $\mu$m. The cantilever 140 is fixed to the actuator 640.

The voltage applying means 430 applies a predetermined voltage to between the probe 20 and the Be plate 510. A too large current flowing between the probe 20 and the Be plate 510 could cause a damage or heating of probe 20 thereby to lower the detection accuracy of signals. To prevent it, the current flowing between the probe 20 and the Be plate 520 should better be set to a smaller value. In the present embodiment, the applied voltage is adjusted by the voltage applying means 430 so that the flowing current is within the range of nA to $\mu$A.

The current measuring means 550 measures the current flowing between the Be plate 510 and the probe 20. A voltage drop amount may be measured instead of measuring the current. In that case, an intensity of X-ray is obtained by measuring a voltage drop amount from the value of voltage applied by the voltage applying means 430 before the irradiation of light (X-rays).

The actuator 460 moves the cantilever 140 in the X, Y, Z directions. The actuator 460 in the present embodiment is constructed as one of the tube scanner type as shown in FIG. 13. In the present embodiment, the actuator 460 moves the probe 20 relative to the photoconductive layer 520 in the state that the probe 20 is in contact with the photoconductive layer 520. The actuator 460 makes the probe 20 scan an arbitrary range in the region where the X-ray image irradiates the photoelectric conversion medium 10. The scanning speed and scanning range of probe 20 can be set by changing frequency and amplitude of scanning signals (triangular waves) sent from the controlling means 60 to the actuator 460 through the scanning means 470.

The controlling means 60 drive-controls the actuator 460 in predetermined directions, and obtains an intensity distribution of X-ray image irradiating the photoelectric conversion medium 10 by making a correspondence between positions of probe 20 on the photoconductive layer 520 in the photoelectric conversion medium 10 and measurement results at the positions by current measuring means 550. The display means 70 displays the thus obtained intensity distribution on a screen as an image (sample image) included in the X-ray image.

In the present embodiment, there is a probe displacement measuring system provided for measuring an amount of deflection of cantilever 140 (displacement of probe 20), by which the probe 20 is made to contact with the surface of photoconductive layer 520 at a constant force (about 0.1 $\mu$N). The contact force between the probe 20 and the photoconductive layer 520 is preferably set not more than 0.1 $\mu$N so as not to damage the photoconductive layer 520 upon scanning of probe 20. The probe displacement measuring system is constituted by a reflective part provided on the cantilever 140 in the vicinity of probe 20, a laser source 160 for providing a laser beam as measurement light 150a, light detecting means for detecting the measurement light 150b reflected by the reflective part, and Z-direction controlling means 470 for detecting a deflection amount (displace amount) of cantilever 140 from an output from the light detecting means 170, which has a feedback amp for driving the actuator 460 in the Z direction through the controlling means 60 such that the deflection amount becomes a certain value (or such that the output from the light detecting means 170 is kept at a certain level). A bisectional photodetector is used as the light detecting means 170. In this displacement measuring system, the measurement light 150a is let to irradiate the cantilever 140, the bisectional photodetector (light detecting means) 170 receives the reflected light, and the displacement of probe 20 can be detected from a differential output from the photodetector. Since the detected displacement amount herein corresponds to the contact force between the probe 20 and the photoconductive layer 520, with feedback control to keep the displace amount constant, the contact force may be kept constant, whereby the contact state between the probe 20 and the photoconductive layer 520 can be stabilized. The displacement measuring system preferably has a resolution of subnanometer order. In addition to the arrangement employed in the present embodiment that the measurement light 150a is radiated toward the cantilever 140, alternative measuring system may be an arrangement that the irradiation light to the reflective part of the cantilever 140 and the reflected light therefrom is made to interfere with each other thereby to measure the displacement of probe 20, or an arrangement that a probe of STM (scanning tunneling microscope) is set on the back surface of the cantilever 140 and a tunnel current flowing between the probe of STM and the cantilever 140 is measured thereby to measure the displacement of probe. The probe displacement measuring system can be omitted if the apparatus is so arranged that the probe 20 is always kept in contact with the surface of photoconductive layer 520 under a constant force. It should be, however, noted that the provision of this displacement measuring system brings an advantage of preventing the photoconductive layer 520 and the probe 20 from colliding with each other so as to be broken upon bringing them into contact with each other.

Next described is the image pickup process using the X-ray microscope in the present embodiment. A sample to be observed (not shown) is first set in the sample holder 570. Then the evacuating means evacuates the vacuum receptacle (not shown) up to a predetermined degree of vacuum in the path of X-rays 580. In the image pickup means 610 the actuator 460 is driven to move the cantilever 140 in the Z direction so that the probe 20 comes to contact with the surface of photoconductive layer 520 in the photoelectric conversion medium 10. In that occasion, the probe displacement measuring system is activated to detect if the probe 20 contacts with the photoconductive layer 520, and the probe 20 is further moved about 5 µm from the contact position to the photoelectric conversion medium 10, whereby a force of about 0.1 µN acts between the probe 20 and the photoconductive layer 520. After that, the voltage applying means 430 is activated to apply a voltage several ten millivolts to several volts lower than that on the Be plate 510 to the probe 20 and then the controlling means 60 drives the actuator 460 to make the probe 20 scan the surface of photoconductive layer 520. This produces a certain potential difference between the two surfaces of photoconductive layer 520 (surface on the Be plate 510 side and the surface on the probe 20 side). Then the X-rays 580 are emitted from the X-ray source 560 in this state.

The X-rays 580 emitted from the X-ray source 560 are collected by the illumination zone plate 590 and then pass through the pin hole 600 to be made monochromatic and then to irradiate the sample held by the sample holder 570. The divergent X-ray image passing through the sample is converged by the focusing zone plate 620 to impinge on the photoelectric conversion medium 10 (Be plate 510). The incident X-ray image includes image information which reflects the structure of sample or the like. The controlling means 60 drives the actuator 460 in the state that the X-ray image irradiates the photoelectric conversion medium 10 (Be plate 510). The drive of actuator 460 moves the cantilever 140 in a predetermined direction, and the probe 20 provided on the fore end of cantilever 140 starts scanning the surface of photoconductive layer 520. The scanning range of probe 20 is preliminarily set by the controlling means 60 and then the actuator 460 moves the cantilever 140 such that the probe 20 scans the predetermined region based on the setting. Drive signals for the actuator 460 output from the controlling means 60 are input into the actuator 460 after D/A-converted, though FIG. 15 does not show it. The current measuring means 550 measures a value of current flowing between the probe 20 and the Be plate 510 at each scan position (contact position) of probe 20 on the photoconductive layer 520, and outputs measurement results to the controlling means 60. After signals representing the current values are amplified by a preamp (not shown), they are A/D-converted by A/D converter (not shown) then to be input into the controlling means 60. The controlling means 60 obtains an intensity distribution of X-ray image illuminating the photoelectric conversion medium 10 from the current values received from the current measuring means 550 and positions of probe 20 where the values were measured on the photoelectric conversion medium 10 (photoconductive layer 520), and outputs the result to the display means 70. The display means 70 displays in gray scale the intensity distribution of X-ray image sent from the controlling means 60 on a screen as an image of sample included in the X-ray image.

The apparatus may be so arranged that the probe displacement measuring system controls the deflection amount of cantilever 140 to keep it constant during scanning of probe 20 in image pickup, whereby the probe 20 is always kept in contact with the photoconductive layer 520 at a constant contact force. Such an arrangement, however, needs a care that since a laser beam is used as measurement light 150a to irradiate the reflective cantilever 140, the laser beam must be kept from influencing the measurement of intensity distribution of X-ray image irradiating the photoelectric conversion medium 10.

In the present embodiment the image pickup means 610 has its own maximum length of about 25 mm, which is shorter than the average length of conventional vidicon (100 to 200 mm). As a result, the X-ray microscope itself into which the image pickup means 610 is incorporated can be made smaller. A spatial resolution obtained was of submicron order and images were observed without lowering the resolution determined by the wavelength of X-rays.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A scanning optical detection apparatus comprising:

a photoelectric conversion medium for making a change in electric property according to incidence of a light image in a wavelength range of from the infrared region to the gamma-ray region;

a probe arranged in contact with said photoelectric conversion medium;

scanning means for relatively scanning said probe relative to said photoelectric conversion medium;

urging means for urging said probe against said photoelectric conversion medium by a predetermined urging force so as to permit slide-contact therebetween;

detecting means for detecting through said probe said change in electric property made in said photoelectric conversion medium; and information processing means for forming distribution information corresponding to said light image by making a correspondence between said change in electric property detected by said detecting means and a relative scan position between said probe and said photoelectric conversion medium.

2. A scanning optical detection apparatus according to claim 1, wherein said photoelectric conversion medium comprises a photoelectron emission layer for internally emitting photoelectrons according to the incidence of light image in said wavelength range, and a charge storage layer made of a non-conductive material and stuck on said photoelectron emission layer through an insulating layer, for storing a positive charge corresponding to said photoelectrons and wherein said detecting means detects through said probe the distribution of positive charge stored in said charge storage layer as the change in electric property.

3. A scanning optical detection apparatus according to claim 1, wherein said photoelectric conversion medium comprises a charge storage layer made of a non-conductive material, for externally emitting photoelectrons according to the incidence of light image in said wavelength range and storing a positive charge corresponding to an emission amount of said photoelectrons, and an auxiliary layer deposited on said charge storage layer and made of a p-type semiconductor, for producing a depletion layer corresponding to a distribution of said positive charge and wherein said detecting means detects through said probe the distribution of positive charge stored in said charge storage layer as the change in electric property.

4. A scanning optical detection apparatus according to claim 1, wherein said photoelectric conversion medium comprises a semiconductor layer made of a semiconductor which changes an internal impedance according to the incidence of light image in said wavelength range and wherein said detecting means detects through said probe a change in said impedance produced in said photoconductive layer as said change in electric property.

5. A scanning optical detection apparatus according to claim 1, wherein said photoelectric conversion medium comprises a photoconductive layer made of a photoconductive material which changes an internal impedance according to the incidence of light image in said wavelength range and a transparent electrode layer laminated on said photoconductive layer and wherein said detecting means detects through said probe a change in said impedance produced between said transparent electrode layer and photoconductive layer as said change in electric property.

6. A scanning optical detection apparatus according to claim 1, wherein said urging means comprises:
  a flexible member having flexibility, for supporting said probe;
  a reflective surface provided at one end of said flexible member;
  a light source for radiating light onto said reflective surface;
  light detecting means for detecting reflected light reflected by said reflective surface; and
  controlling means for controlling said urging force such that the reflected light detected by said light detecting means is always constant.

7. A scanning optical detection apparatus according to claim 1, wherein said probe comprises a core body made of Silicon material, a NiCr alloy thin layer deposited on an end plane of said core body on the photoelectric conversion medium side, and a thin layer made of Au and deposited on said NiCr alloy thin layer, which is made in contact with said photoelectric conversion medium, and wherein said probe is produced by the lithography technology.

8. An optical detection method comprising:
  letting a probe contact at a predetermined urging force with a photoelectric conversion medium which produces a change in electric property according to incidence of light image in a wavelength range of from the infrared region to the gamma-ray region;
  relatively scanning said probe relative to said photoelectric conversion medium in contact therewith and detecting through said probe said change in electric property produced in said photoelectric conversion medium; and
  obtaining distribution information corresponding to said light image in said wavelength range by making a correspondence between said change in electric property thus detected and a relative scan position between said probe and said photoelectric conversion medium.

9. An optical detection method according to claim 8, wherein employed as said photoelectric conversion medium is a medium comprising a photoelectron emission layer for internally emitting photoelectrons according to the incidence of light image in said wavelength range, and a charge storage layer made of a non-conductive material and laminated on said photoelectron emission layer through an insulating layer, for storing a positive charge corresponding to said photoelectrons and wherein said detecting step is a step of detecting through said probe a distribution of positive charge stored in said charge storage layer as said change in electric property.

10. An optical detection method according to claim 8, wherein employed as said photoelectric conversion medium is a medium comprising a charge storage layer made of a non-conductive material which externally emits photoelectrons according to incidence of light image in said wavelength range and stores a positive charge corresponding to an emission amount of said photoelectrons, and an auxiliary layer deposited on said charge storage layer and made of a p-type semiconductor which produces a depletion layer corresponding to a distribution of said positive charge and wherein said detecting step is a step of detecting through said probe the distribution of positive charge stored in said charge storage layer as said change in electric property.

11. An optical detection method according to claim 8, wherein employed as said photoelectric conversion medium is a medium comprising a photoconductive layer made of a photoconductive material which changes an internal resistance according to incidence of light image in said wavelength range and wherein said detecting step is a step of detecting through said probe a change in said impedance produced in said photoconductive layer as said change in electric property.

12. An optical detection method according to claim 8, wherein employed as said photoelectric conversion medium is a medium comprising a photoconductive layer made of a photoconductive material which changes an internal impedance according to incidence of light image in said wavelength range, and a transparent electrode layer on said photoconductive layer and wherein said detecting step is a step of detecting through said probe a change in said impedance produced between said transparent electrode layer and photoconductive layer as said change in electric property.

13. A scanning optical detection apparatus comprising:
  a photoelectric conversion medium for making a change in electric property according to incidence of a light image in a wavelength range of from the infrared region to the gamma-ray region;
  a probe arranged in contact with said photoelectric conversion medium;
  scanning means for relatively scanning said probe relative to said photoelectric conversion medium;
  urging means for urging said probe against said photoelectric conversion medium so as to permit slide-contact therebetween; and
  detecting means for detecting through said probe said change in electric property made in said photoelectric conversion medium.

\* \* \* \* \*